US010230330B2

United States Patent
Kudo

(10) Patent No.: US 10,230,330 B2
(45) Date of Patent: Mar. 12, 2019

(54) OSCILLATOR AND CALCULATING DEVICE

(71) Applicant: Kabushiki Kaisha Toshiba, Minato-ku (JP)

(72) Inventor: Kiwamu Kudo, Kamakura (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 197 days.

(21) Appl. No.: 15/438,902

(22) Filed: Feb. 22, 2017

(65) Prior Publication Data

US 2017/0331484 A1 Nov. 16, 2017

(30) Foreign Application Priority Data

May 13, 2016 (JP) ................................. 2016-097276

(51) Int. Cl.
*B82Y 25/00* (2011.01)
*H01F 10/32* (2006.01)
(Continued)

(52) U.S. Cl.
CPC ......... *H03B 15/006* (2013.01); *H01F 10/329* (2013.01); *H01F 10/3263* (2013.01);
(Continued)

(58) Field of Classification Search
CPC .... H03B 15/00; H03B 15/006; G11C 11/161; G11C 11/18; G11C 11/16; H01L 43/04;
(Continued)

(56) References Cited

U.S. PATENT DOCUMENTS 7,764,538 B2 7/2010 Ito
8,897,047 B2 11/2014 Bourianoff et al.
(Continued)

FOREIGN PATENT DOCUMENTS

JP 2007-142746 6/2007
JP 2010-206023 9/2010
(Continued)

OTHER PUBLICATIONS

Kiselev, S. II, et al. "Microwave oscillations of a nanomagnet driven by a spin-polarized current." nature 425.6956 (2003): 380. (Year: 2003).*
(Continued)

*Primary Examiner* — Ryan Johnson
(74) *Attorney, Agent, or Firm* — Oblon, McClelland, Maier & Neustadt, L.L.P.

(57) ABSTRACT

According to one embodiment, an oscillator includes first to third conductive bodies, a first stacked unit, and a magnetic unit. The first conductive body includes first, second region, and third regions. The second conductive body includes a portion separated from the third region. The first stacked unit is provided between the third region and the portion. The first stacked unit includes first to fourth magnetic layers, and first to third intermediate layers. At least a portion of the magnetic unit and at least a portion of the first stacked unit overlap each other. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization.

23 Claims, 20 Drawing Sheets

(51) Int. Cl.
*H03B 15/00* (2006.01)
*H01L 43/06* (2006.01)
*H01L 27/22* (2006.01)

(52) U.S. Cl.
CPC ............... *B82Y 25/00* (2013.01); *H01L 27/22* (2013.01); *H01L 43/06* (2013.01); *H03B 2200/0076* (2013.01)

(58) Field of Classification Search
CPC ....... H01L 43/06; H01L 43/065; H01L 27/22; H01L 29/66984; H01F 10/329; H01F 10/3286; H01F 10/3263; H01F 10/3272; B82Y 25/00
See application file for complete search history.

(56) References Cited

U.S. PATENT DOCUMENTS

| | | | |
|---|---|---|---|
| 9,230,626 | B2 | 1/2016 | Buhrman et al. |
| 2015/0200003 | A1* | 7/2015 | Buhrman ............... G11C 11/18 365/158 |
| 2016/0260467 | A1 | 9/2016 | Kudo |

FOREIGN PATENT DOCUMENTS

| | | |
|---|---|---|
| JP | 5224803 | 7/2013 |
| JP | 2016-162978 | 9/2016 |

OTHER PUBLICATIONS

Liu, Luqiao, et al. "Magnetic oscillations driven by the spin Hall effect in 3-terminal magnetic tunnel junction devices." Physical review letters 109.18 (2012): 186602. (Year: 2012).*

Khalsa, Guru, Mark D. Stiles, and Julie Grollier. "Critical current and linewidth reduction in spin-torque nano-oscillators by delayed self-injection." Applied Physics Letters 106.24 (2015): 242402. (Year: 2015).*

Dürrenfeld, P., et al. "Parametric excitation in a magnetic tunnel junction-based spin torque oscillator." Applied Physics Letters 104.5 (2014): 052410. (Year: 2014).*

B. Georges, et al, "Impact of the electrical connection of spin transfer nano-oscillators on their synchronization: an analytical study", Applied Physics Letters 92, 2008, 4 pgs.

* cited by examiner

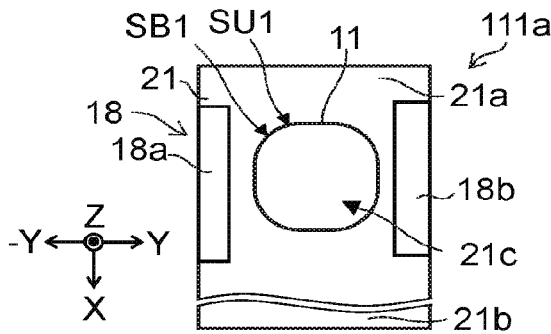
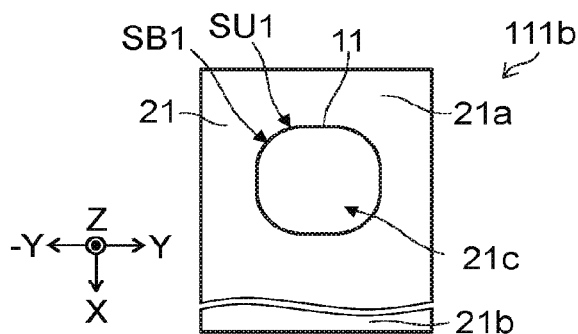
FIG. 5A      FIG. 5B
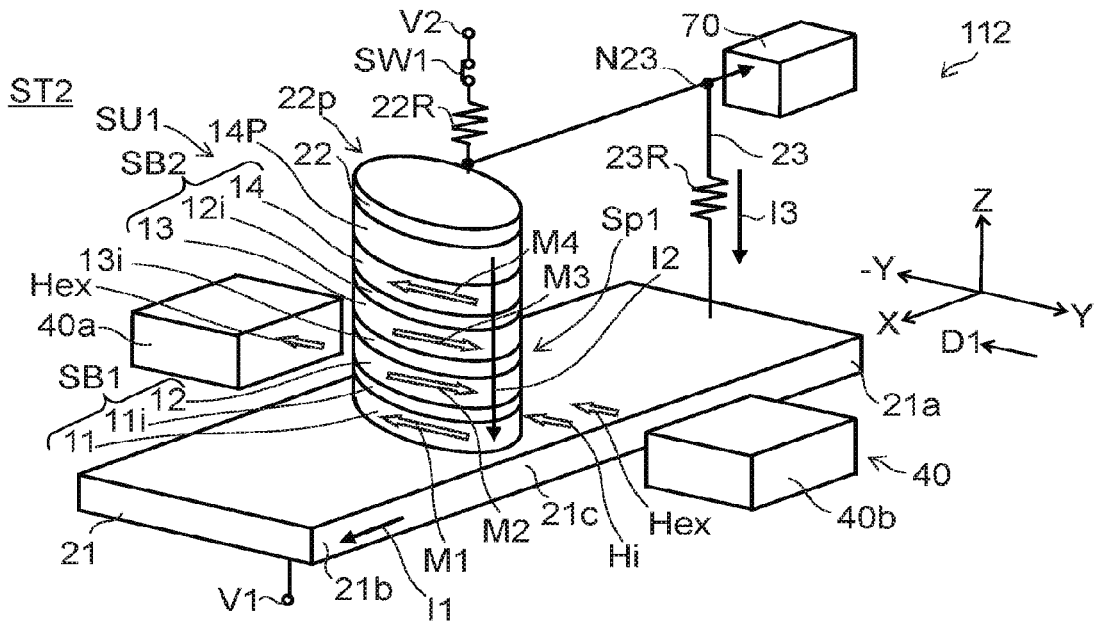
FIG. 6A
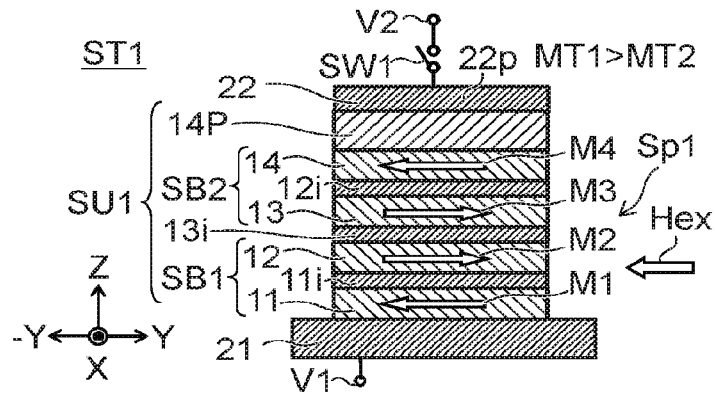
FIG. 6B

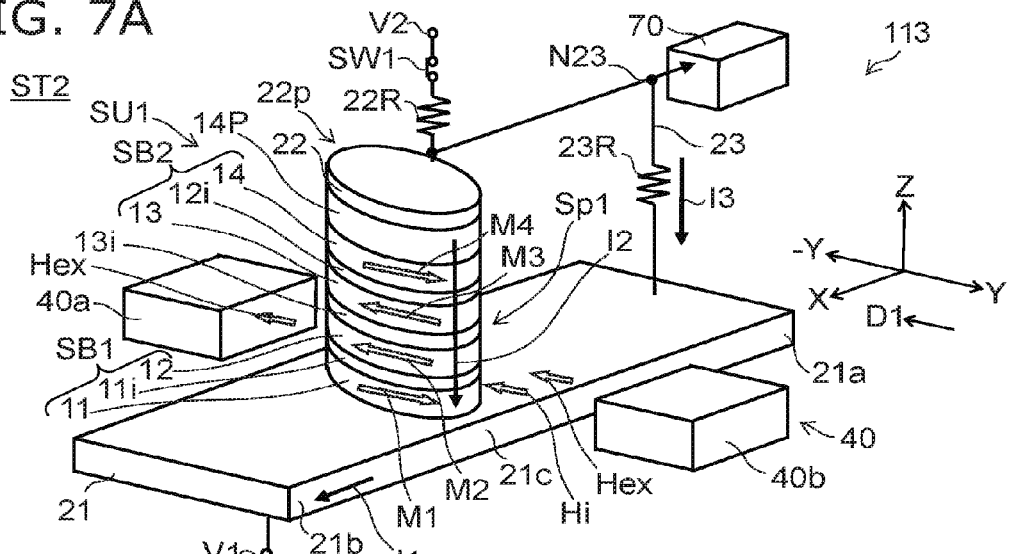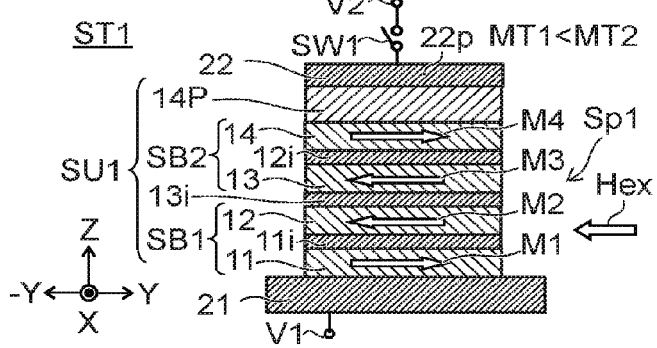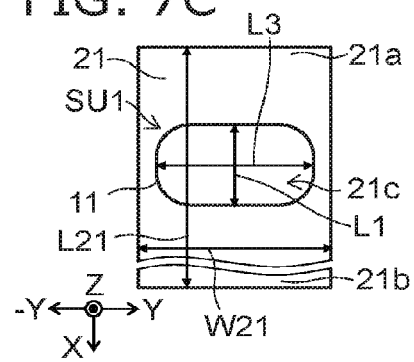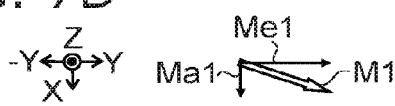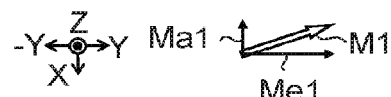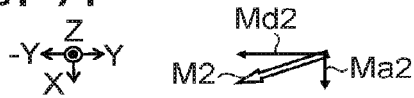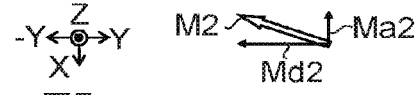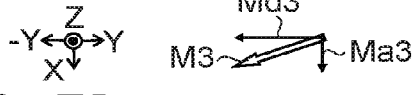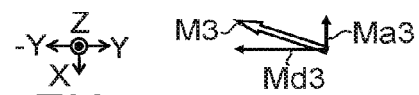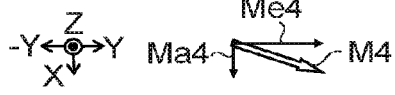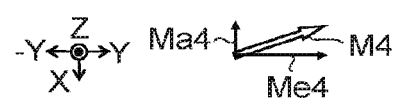

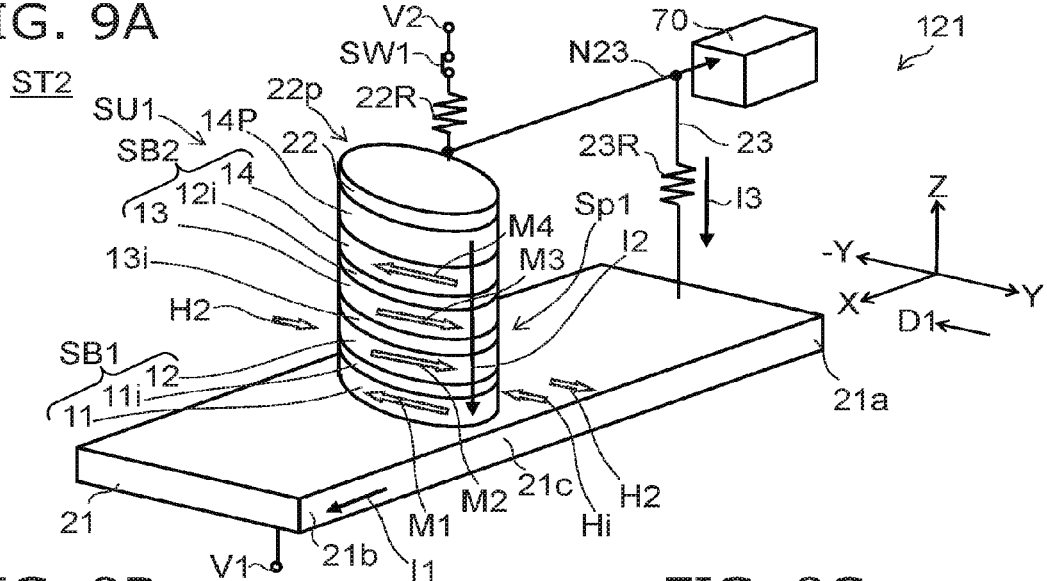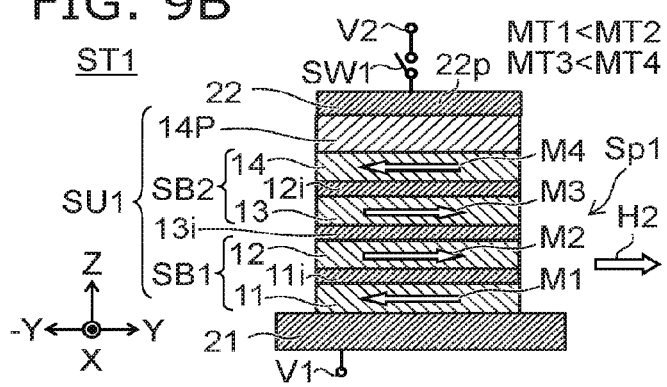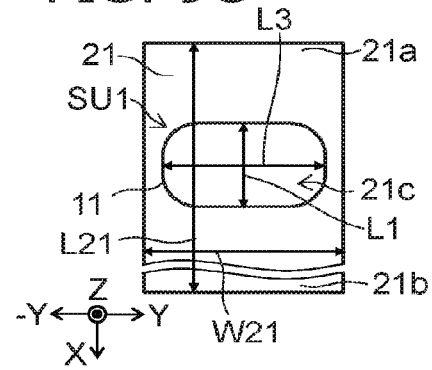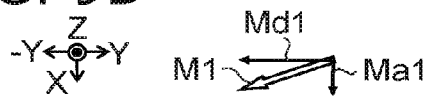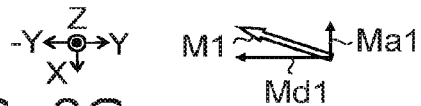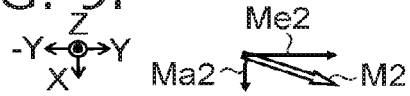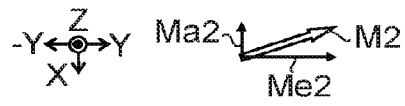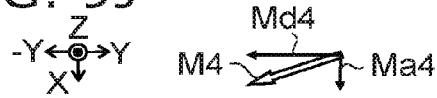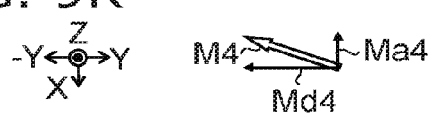

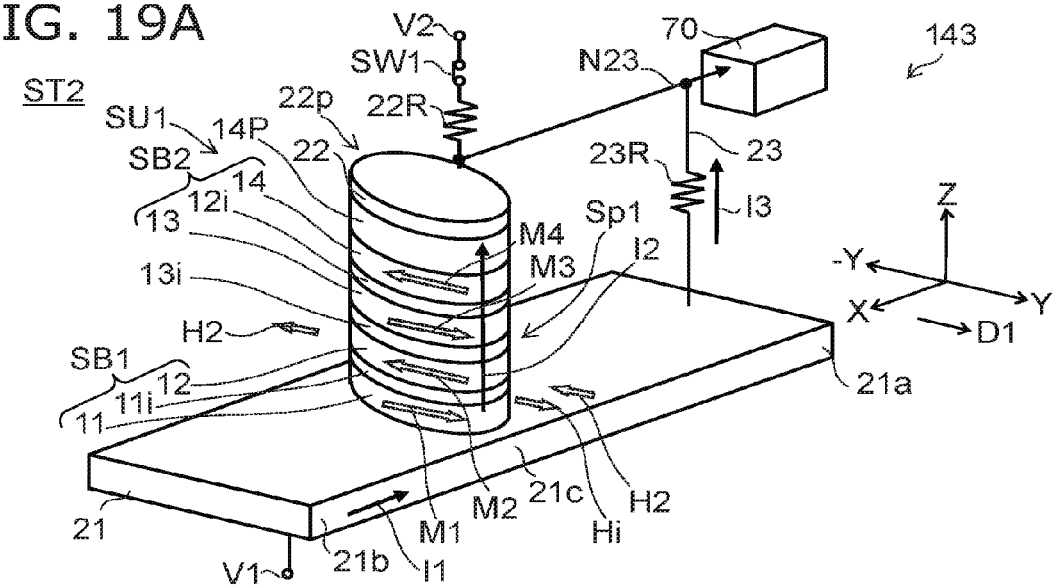
FIG. 19A
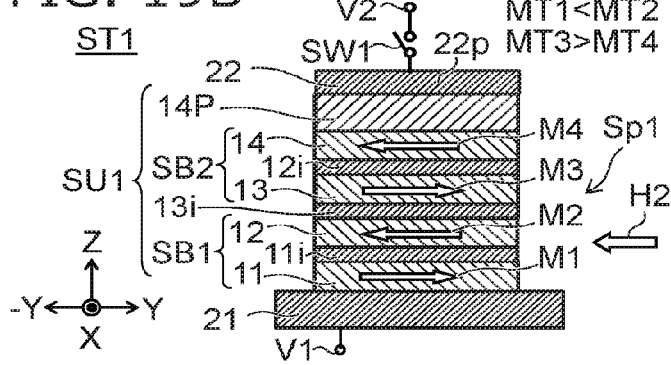
FIG. 19B
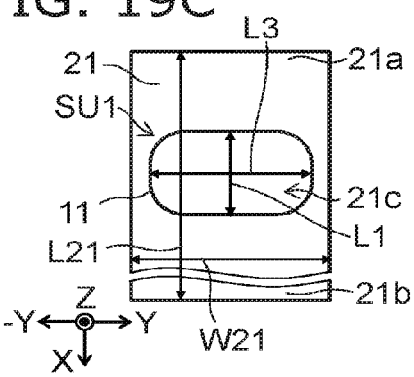
FIG. 19C
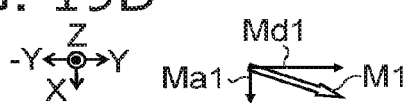
FIG. 19D  FIG. 19E
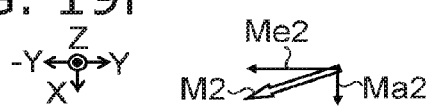
FIG. 19F  FIG. 19G
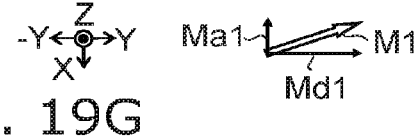
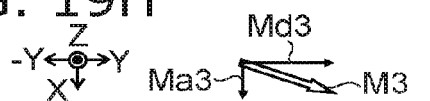
FIG. 19H  FIG. 19I
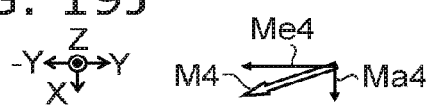
FIG. 19J  FIG. 19K

OSCILLATOR AND CALCULATING DEVICE

CROSS-REFERENCE TO RELATED APPLICATIONS

This application is based upon and claims the benefit of priority from Japanese Patent Application No. 2016-097276, filed on May 13, 2016; the entire contents of which are incorporated herein by reference.

FIELD

Embodiments described herein relate generally to an oscillator and a calculating device.

BACKGROUND

An oscillator such as a spin torque oscillator or the like that uses a magnetic layer has been proposed. Stable oscillations of the oscillator are desirable.

BRIEF DESCRIPTION OF THE DRAWINGS

FIG. 5A and FIG. 5B are schematic plan views illustrating other oscillators according to the first embodiment;

FIG. 6A and FIG. 6B are schematic views illustrating another oscillator according to the first embodiment;

FIG. 7A to FIG. 7K are schematic views illustrating another oscillator according to the first embodiment;

FIG. 9A to FIG. 9K are schematic views illustrating an oscillator according to a second embodiment;

FIG. 19A to FIG. 19K are schematic views illustrating another oscillator according to the fourth embodiment;

DETAILED DESCRIPTION

Figure 1A:
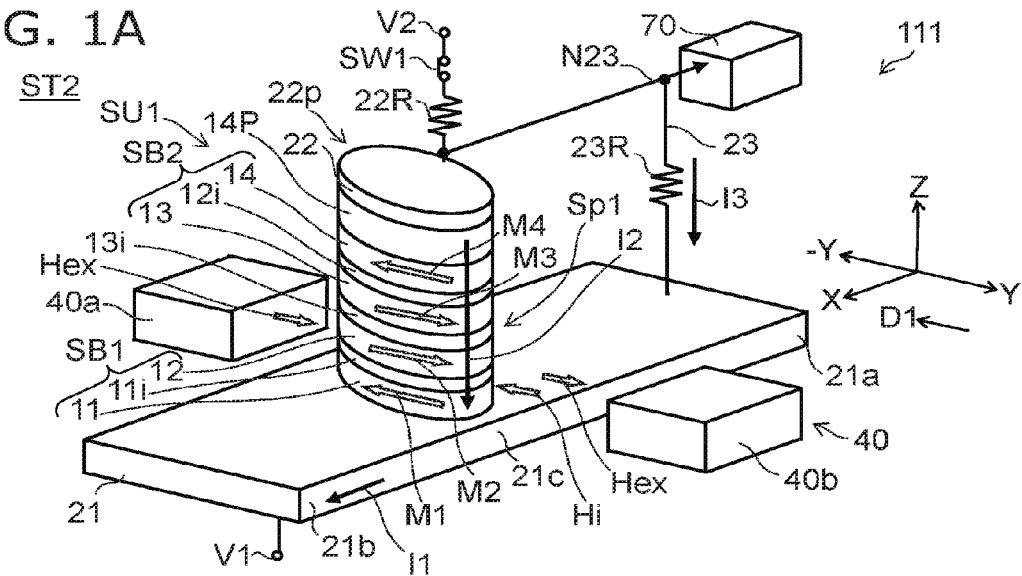
FIG. 1A to FIG. 1K are schematic views illustrating an oscillator according to a first embodiment.

According to one embodiment, an oscillator includes first to third conductive bodies, a first stacked unit, and a magnetic unit. The first conductive body includes a first region, a second region, and a third region, the second region being arranged with the first region in a first direction, the third region being provided between the first region and the second region. The second conductive body includes a portion separated from the third region in a second direction crossing the first direction. The first stacked unit is provided between the third region and the portion. The first stacked unit includes first to fourth magnetic layers, and first to third intermediate layers. The first magnetic layer has a first magnetization. The second magnetic layer has a second magnetization and is provided between the first magnetic layer and the portion. The first intermediate layer is provided between the first magnetic layer and the second magnetic layer. The third magnetic layer has a third magnetization and is provided between the second magnetic layer and the portion. The fourth magnetic layer has a fourth magnetization and is provided between the third magnetic layer and the portion. The second intermediate layer is provided between the third magnetic layer and the fourth magnetic layer. The third intermediate layer is provided between the second magnetic layer and the third magnetic layer. The third conductive body is electrically connected to the second conductive body and the first region. At least a portion of the magnetic unit and at least a portion of the first stacked unit overlap each other in a direction crossing the first direction and the second direction. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization.

According to another embodiment, an oscillator includes first to third conductive bodies, and a first stacked unit. The first conductive body includes a first region, a second region, and a third region, the second region being arranged with the first region in a first direction, the third region being provided between the first region and the second region. The second conductive body includes a portion separated from the third region in a second direction crossing the first direction. The first stacked unit is provided between the third region and the portion. The first stacked unit includes first to fourth magnetic layers, and first to third intermediate layers. The first magnetic layer has a first magnetization. The second magnetic layer has a second magnetization and is provided between the first magnetic layer and the portion. The first intermediate layer is provided between the first magnetic layer and the second magnetic layer. The third magnetic layer has a third magnetization and is provided between the second magnetic layer and the portion. The fourth magnetic layer has a fourth magnetization and is provided between the third magnetic layer and the portion.

The second intermediate layer is provided between the third magnetic layer and the fourth magnetic layer. The third intermediate layer is provided between the second magnetic layer and the third magnetic layer. The third conductive body is electrically connected to the second conductive body and the first region. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization. A current magnetic field is generated in a space between the third region and the portion. The current magnetic field has a first orientation along the third direction when a current is caused to flow in the first conductive body from the first region toward the second region. In the first state, a component in the first orientation of the first magnetization is larger than a component in the first direction of the first magnetization. In the first state, a component in the first orientation of the fourth magnetization is larger than a component in the first direction of the fourth magnetization. The first conductive body includes at least one of Ta, W, or Re. The first stacked unit satisfies one of a first condition or a second condition in the first state. In the first condition, a first magnetic moment of the first magnetic layer is smaller than a second magnetic moment of the second magnetic layer, and a third magnetic moment of the third magnetic layer is smaller than a fourth magnetic moment of the fourth magnetic layer. In the second condition, the first magnetic moment of the first magnetic layer is larger than the second magnetic moment of the second magnetic layer, and the third magnetic moment of the third magnetic layer is larger than the fourth magnetic moment of the fourth magnetic layer.

According to another embodiment, an oscillator includes first to third conductive bodies, and a first stacked unit. The first conductive body includes a first region, a second region, and a third region, the second region being arranged with the first region in a first direction, the third region being provided between the first region and the second region. The second conductive body includes a portion separated from the third region in a second direction crossing the first direction. The first stacked unit is provided between the third region and the portion. The first stacked unit includes first to fourth magnetic layers, and first to third intermediate layers. The first magnetic layer has a first magnetization. The second magnetic layer has a second magnetization and is provided between the first magnetic layer and the portion. The first intermediate layer is provided between the first magnetic layer and the second magnetic layer. The third magnetic layer has a third magnetization and is provided between the second magnetic layer and the portion. The fourth magnetic layer has a fourth magnetization and is provided between the third magnetic layer and the portion. The second intermediate layer is provided between the third magnetic layer and the fourth magnetic layer. The third intermediate layer is provided between the second magnetic layer and the third magnetic layer. The third conductive body is electrically connected to the second conductive body and the first region. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization. A current magnetic field is generated in a space between the third region and the portion. The current magnetic field has a first orientation along the third direction when a current is caused to flow in the first conductive body from the first region toward the second region. In the first state, a component in the first orientation of the second magnetization is larger than a component in the first direction of the second magnetization. In the first state, a component in the first orientation of the third magnetization is larger than a component in the first direction of the third magnetization. The first conductive body includes at least one of Ru, Rh, Pd, Os, or Pt. The first stacked unit satisfies one of a first condition or a second condition in the first state. In the first condition, a first magnetic moment of the first magnetic layer is smaller than a second magnetic moment of the second magnetic layer, and a third magnetic moment of the third magnetic layer is smaller than a fourth magnetic moment of the fourth magnetic layer. In the second condition, the first magnetic moment of the first magnetic layer is larger than the second magnetic moment of the second magnetic layer, and the third magnetic moment of the third magnetic layer is larger than the fourth magnetic moment of the fourth magnetic layer.

According to another embodiment, an oscillator includes first to third conductive bodies, and a first stacked unit. The first conductive body includes a first region, a second region, and a third region, the second region being arranged with the first region in a first direction, the third region being provided between the first region and the second region. The second conductive body includes a portion separated from the third region in a second direction crossing the first direction. The first stacked unit is provided between the third region and the portion. The first stacked unit includes first to fourth magnetic layers, and first to third intermediate layers. The first magnetic layer has a first magnetization. The second magnetic layer has a second magnetization and is provided between the first magnetic layer and the portion. The first intermediate layer is provided between the first magnetic layer and the second magnetic layer. The third magnetic layer has a third magnetization and is provided between the second magnetic layer and the portion. The fourth magnetic layer has a fourth magnetization and is provided between the third magnetic layer and the portion. The second intermediate layer is provided between the third magnetic layer and the fourth magnetic layer. The third intermediate layer is provided between the second magnetic layer and the third magnetic layer. The third conductive body is electrically connected to the second conductive body and the first region. The first conductive body includes at least one of Ru, Rh, Pd, Os and Pt. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization. A current magnetic field is generated in a space between the third region and the portion. The current magnetic field has a first orientation along the third direction when a current is caused to flow in the first conductive body from the second region toward the first region. In the first state, a component in the first orientation of the second magnetization is larger than a component in the first direction of the second magnetization, and a component in the first orientation of the fourth magnetization is larger than a component in the first direction of the fourth magnetization. The first stacked unit satisfies one of a first condition or a second condition in the first state. In the first condition, a first magnetic moment of the first magnetic layer is smaller than a second magnetic moment of the second magnetic layer, and a third magnetic moment of the third magnetic layer is larger than a fourth magnetic moment of the fourth magnetic layer. In the second condition, the first magnetic moment of the first magnetic layer is larger than the second magnetic moment of the second magnetic layer, and the third magnetic moment of the third magnetic layer is smaller than the fourth magnetic moment of the fourth magnetic layer.

According to another embodiment, an oscillator includes first to third conductive bodies, and a first stacked unit. The first conductive body includes a first region, a second region, and a third region, the second region being arranged with the first region in a first direction, the third region being provided between the first region and the second region. The second conductive body includes a portion separated from the third region in a second direction crossing the first direction. The first stacked unit is provided between the third region and the portion. The first stacked unit includes first to fourth magnetic layers, and first to third intermediate layers. The first magnetic layer has a first magnetization. The second magnetic layer has a second magnetization and is provided between the first magnetic layer and the portion. The first intermediate layer is provided between the first magnetic layer and the second magnetic layer. The third magnetic layer has a third magnetization and is provided between the second magnetic layer and the portion. The fourth magnetic layer has a fourth magnetization and is provided between the third magnetic layer and the portion. The second intermediate layer is provided between the third magnetic layer and the fourth magnetic layer. The third intermediate layer is provided between the second magnetic layer and the third magnetic layer. The third conductive body is electrically connected to the second conductive body and the first region. The first conductive body includes at least one of Ta, W, or Re. In a first state, the first to fourth magnetizations are aligned with a third direction perpendicular to the first direction and the second direction. The second magnetization has a component in a reverse orientation of the first magnetization. The fourth magnetization has a component in a reverse orientation of the third magnetization. A current magnetic field is generated in a space between the third region and the portion. The current magnetic field has a first orientation along the third direction when a current is caused to flow in the first conductive body from the second region toward the first region. A component in the first orientation of the first magnetization is larger than a component in the first direction of the first magnetization, and a component in the first orientation of the third magnetization is larger than a component in the first direction of the third magnetization. The first stacked unit satisfies one of a first condition or a second condition in the first state. In the first condition, a first magnetic moment of the first magnetic layer is smaller than a second magnetic moment of the second magnetic layer, and a third magnetic moment of the third magnetic layer is larger than a fourth magnetic moment of the fourth magnetic layer. In the second condition, the first magnetic moment of the first magnetic layer is larger than the second magnetic moment of the second magnetic layer, and the third magnetic moment of the third magnetic layer is smaller than the fourth magnetic moment of the fourth magnetic layer.

According to another embodiment, a calculating device includes the oscillator according to one of the above, and a magnetic element unit. At least a portion of the magnetic element unit and at least a portion of the first stacked unit overlap each other in the third direction.

According to another embodiment, an electronic device includes the oscillator according to one of the above, and a functional unit receiving an output from the oscillator.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1A to FIG. 1K are schematic views illustrating an oscillator according to a first embodiment.

Figure 1B:
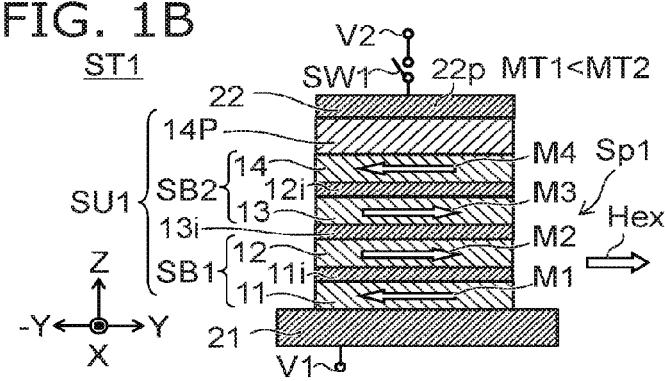
Figure 1C:
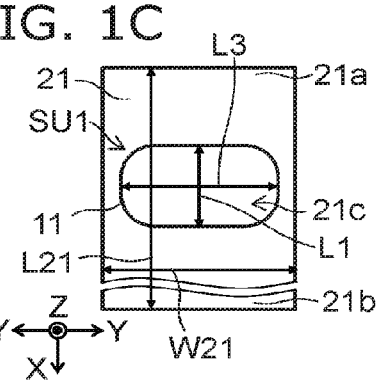

FIG. 1A is a perspective view. FIG. 1B is a cross-sectional view. FIG. 1C is a plan view. FIG. 1D to FIG. 1K are plan views illustrating magnetizations.

As shown in FIG. 1A, the oscillator 111 according to the embodiment includes a first conductive body 21, a second conductive body 22, a third conductive body 23, a first stacked unit SU1, and a magnetic unit 40.

The first conductive body 21 includes a first region 21a, a second region 21b, and a third region 21c. The second region 21b is arranged with the first region 21a in a first direction. The third region 21c is provided between the first region 21a and the second region 21b. These regions are partial regions.

The first direction is taken as an X direction. One direction perpendicular to the X direction is taken as a Z direction. A direction perpendicular to the X direction and the Z direction is taken as a Y direction. The −Y direction is the reverse orientation of the Y direction.

The first conductive body 21 is, for example, a conductive layer. For example, the first conductive body 21 extends in the X direction. A length L21 in the X direction of the first conductive body 21 is longer than a length (a width W21) in the Y direction of the first conductive body 21 (referring to FIG. 1C).

As shown in FIG. 1A and FIG. 1B, the second conductive body 22 includes a portion 22p separated from the third region 21c in a second direction. The second direction crosses the first direction (the X direction). In the example, the second direction is the Z direction.

The first stacked unit SU1 is provided between the third region 21c and the portion 22p recited above. The first stacked unit includes first to fourth magnetic layers 11 to 14 and first to third intermediate layers 11i to 13i.

In the example, the first magnetic layer 11 physically contacts the third region 21c of the first conductive body 21. A second magnetic layer 12 is provided between the first magnetic layer 11 and the portion 22p recited above. The first intermediate layer 11i is provided between the first magnetic layer 11 and the second magnetic layer 12. A third magnetic layer 13 is provided between the second magnetic layer 12 and the portion 22p recited above. The fourth magnetic layer 14 is provided between the third magnetic layer 13 and the portion 22p recited above. A second intermediate layer 12i is provided between the third magnetic layer 13 and the fourth magnetic layer 14. The third intermediate layer 13i is provided between the second magnetic layer 12 and the third magnetic layer 13.

The first to fourth magnetic layers 11 to 14 respectively have first to fourth magnetizations M1 to M4. In a first state ST1 (referring to FIG. 1B), the first to fourth magnetizations M1 to M4 are aligned with a third direction. The third direction is perpendicular to the first direction (the X direction) and the second direction (e.g., the Z direction). In the example, the third direction is the Y direction or the −Y direction. As described below, in the first state ST1, a current substantially does not flow inside the first stacked unit SU1.

In the first state ST1, a second magnetization M2 has a component in the reverse orientation of the first magnetization M1. For example, the second magnetization M2 is substantially antiparallel to the first magnetization M1. The first magnetic layer 11, the first intermediate layer 11i, and the second magnetic layer 12 are included in a first stacked body SB1. The first stacked body SB1 is, for example, a synthetic ferri layer.

In the first state ST1, the fourth magnetization M4 has a component in the reverse orientation of a third magnetization M3. For example, the fourth magnetization M4 is substantially antiparallel to the third magnetization M3. The third magnetic layer 13, the second intermediate layer 12i, and the fourth magnetic layer 14 are included in a second stacked body SB2. The second stacked body SB2 is, for example, a synthetic ferri layer.

In the example as shown in FIG. 1C, a length L3 along the third direction (the Y direction or the −Y direction) of the first magnetic layer 11 is not less than a length L1 along the first direction (the X direction) of the first magnetic layer 11. The length L3 may be longer than the length L1. For example, the first magnetic layer 11 has shape anisotropy. For example, due to the shape anisotropy, the first magnetization M1 of the first magnetic layer 11 in the first state ST1 is substantially aligned with the third direction.

In the example, the first magnetization M1 is oriented substantially in the −Y direction. The second magnetization M2 is oriented substantially in the Y direction. The third magnetization M3 is oriented substantially in the Y direction. The third magnetization M3 is oriented substantially in the −Y direction.

FIG. 1D to FIG. 1K show examples of the magnetizations in the first state ST1. The first to fourth magnetizations M1 to M4 may be tilted with respect to the third direction (the Y direction or the −Y direction). The angles between the third direction and the directions of these magnetizations are, for example, less than 45 degrees. The examples of the magnetizations are described below.

The third conductive body 23 is electrically connected to the second conductive body 22 and the first region 21a of the first conductive body 21.

At least a portion of the magnetic unit 40 and at least a portion of the first stacked unit SU1 overlap each other in a direction (e.g., the ±Y directions) crossing the first direction (the X direction) and the second direction (e.g., the Z direction). In the example, the magnetic unit 40 includes a first magnetic portion 40a and a second magnetic portion 40b. At least a portion of the first stacked unit SU1 is disposed between the first magnetic portion 40a and the second magnetic portion 40b in a direction (e.g., the ±Y directions) crossing the first direction (the X direction) and the second direction (e.g., the Z direction).

For example, a magnetic unit magnetic field Hex is generated from the magnetic unit 40. The magnetic unit magnetic field Hex is generated in a space Sp1 between the third region 21c of the first conductive body 21 and the portion 22p of the second conductive body 22 recited above. The magnetic unit magnetic field Hex is applied to at least a portion of the first stacked unit SU1. The magnetic unit magnetic field Hex acts on the first stacked unit SU1 as an external magnetic field. In the example, the magnetic unit magnetic field Hex in the space Sp1 recited above has the orientation of the second magnetization M2.

In the example as shown in FIG. 1A and FIG. 1B, the first stacked unit SU1 further includes a second conductive body-side magnetic layer 14P. The second conductive body-side magnetic layer 14P is provided between the fourth magnetic layer 14 and the portion 22p of the second conductive body 22 recited above. For example, the magnetization of the second conductive body-side magnetic layer 14P is fixed. For example, the second conductive body-side magnetic layer 14P fixes the fourth magnetization M4 of the fourth magnetic layer 14. The second conductive body-side magnetic layer 14P is, for example, a pinning layer.

In the example of the oscillator 111, a first magnetic moment MT1 of the first magnetic layer 11 is set to be smaller than a second magnetic moment MT2 of the second magnetic layer 12. The magnetic moment of one magnetic layer is the product of the saturation magnetization of the magnetic layer and the volume of the magnetic layer.

In the example of the oscillator 111, the first conductive body 21 includes at least one of Ta, W, or Re. In these materials, the spin Hall conductivity is negative. In the case where the spin Hall conductivity of the first conductive body 21 is negative and the first magnetic moment MT1 is smaller than the second magnetic moment MT2, the first magnetization M1 is set to the reverse orientation of the current magnetic field generated by the first conductive body 21.

In other words, a current magnetic field Hi is generated when a current is caused to flow in the first conductive body 21 from the first region 21a toward the second region 21b. The current magnetic field Hi that is generated in the space Sp1 between the third region 21c and the portion 22p of the second conductive body 22 recited above has a first orientation D1. The first orientation D1 is aligned with the third direction. As recited above, the third direction is the −Y direction or the Y direction. In the example, the first orientation D1 is the −Y direction.

At this time, in the first state ST1, the first magnetization M1 and the fourth magnetization M4 have the first orientation D1. At this time, the second magnetization M2 and the third magnetization M3 have the reverse orientation of the first orientation D1. The second magnetization M2 and the third magnetization M3 are substantially parallel to each other.

As shown in FIG. 1A, a connection point N23 that is connected to the second conductive body 22 and the third conductive body 23 is provided. The third conductive body 23 includes a resistor 23R. The resistor 23R is provided between the connection point N23 and the first region 21a recited above.

The second region 21b of the first conductive body 21 is settable to a first potential V1. On the other hand, the second conductive body 22 is connected to one end of a switch SW1 via a resistor 22R. The other end of the switch SW1 is settable to a second potential V2. In the example, the second potential V2 is higher than the first potential V1. The first potential V1 is, for example, the ground potential. The second potential V2 is a positive potential. For example, the second potential V2 is provided by a constant voltage source Vdd.

In a second state ST2 illustrated in FIG. 1A, the switch SW1 is in the closed state (the ON state). In the second state ST2, the first stacked unit SU1 oscillates. For example, the oscillation is generated in the first stacked body SB1 based on, for example, spin Hall torque and spin torque. In the second state ST2, for example, the first stacked body SB1 functions as an oscillation generation layer. In the second state ST2, for example, the second stacked body SB2 functions as a spin injection layer.

In the second state ST2, a first current I1 flows from the first region 21a toward the second region 21b. In the second state ST2, a second current I2 flows from the fourth magnetic layer 14 toward the first magnetic layer 11. In the second state ST2, a third current I3 flows through the third conductive body 23 from the second conductive body 22 toward the first region 21a. In such a second state ST2, the connection point N23 that is connected to the second conductive body 22 and the third conductive body 23 oscillates. A circuit unit 70 is connected to the connection point N23. For example, the circuit unit 70 amplifies the potential of the connection point N23. A signal that oscillates is obtained as the output of the circuit unit 70.

On the other hand, in the first state ST1 illustrated in FIG. 1B, the switch SW1 is in the open state (the OFF state). In the first state ST1, for example, the second current I2 does not flow in the first stacked unit SU1. Or, the second current I2 is less than the threshold for the oscillation.

For example, the magnetoresistance effect is generated in the second magnetic layer 12, the third intermediate layer 13i, and the third magnetic layer 13. For example, the third magnetization M3 of the third magnetic layer 13 is substantially fixed; and the angle between the second magnetization M2 and the third magnetization M3 changes when the direction of the second magnetization M2 of the second magnetic layer 12 changes due to the oscillation. Thereby, the electrical resistance of the portion including the second magnetic layer 12, the third intermediate layer 13i, and the third magnetic layer 13 changes according to the angle recited above. The first stacked unit SU1 corresponds to a magnetoresistance effect element unit.

For example, by appropriately setting the first potential V1, the second potential V2, the resistor 22R, and the resistor 23R in the second state ST2 shown in FIG. 1A, the second current I2 that has the appropriate magnitude flows through the first stacked unit SU1. Thereby, the oscillation is generated. According to the oscillator 111, a stable oscillation is obtained.

In the oscillator 111, for example, in the second state ST2 (referring to FIG. 1A), for example, the spin Hall torque acts on the first magnetization M1 of the first magnetic layer 11. The spin Hall torque is caused by the spin Hall effect accompanying the first current I1. Simultaneously, for example, the spin-polarized current spin torque acts on the second magnetization M2 of the second magnetic layer 12. The spin-polarized current spin torque is based on the spin-polarized current of the second current I2 flowing through the first stacked unit SU1. Therefore, in the first stacked body SB1, the two spin torques of the spin Hall torque and the spin-polarized current spin torque act simultaneously. The spin injection is performed efficiently. Thereby, the magnetizations (the first magnetization M1 and the second magnetization M2) of the first stacked body SB1 (the synthetic ferri layer) oscillate.

In the embodiment, by using the two types of spin torque recited above, for example, the two magnetic layers (the first magnetic layer 11 and the second magnetic layer 12) are excited simultaneously. Thereby, a large magnetization oscillation energy is generated. Thereby, a stable oscillation is obtained.

An example of the operations of the oscillator 111 will now be described.

Figure 2:
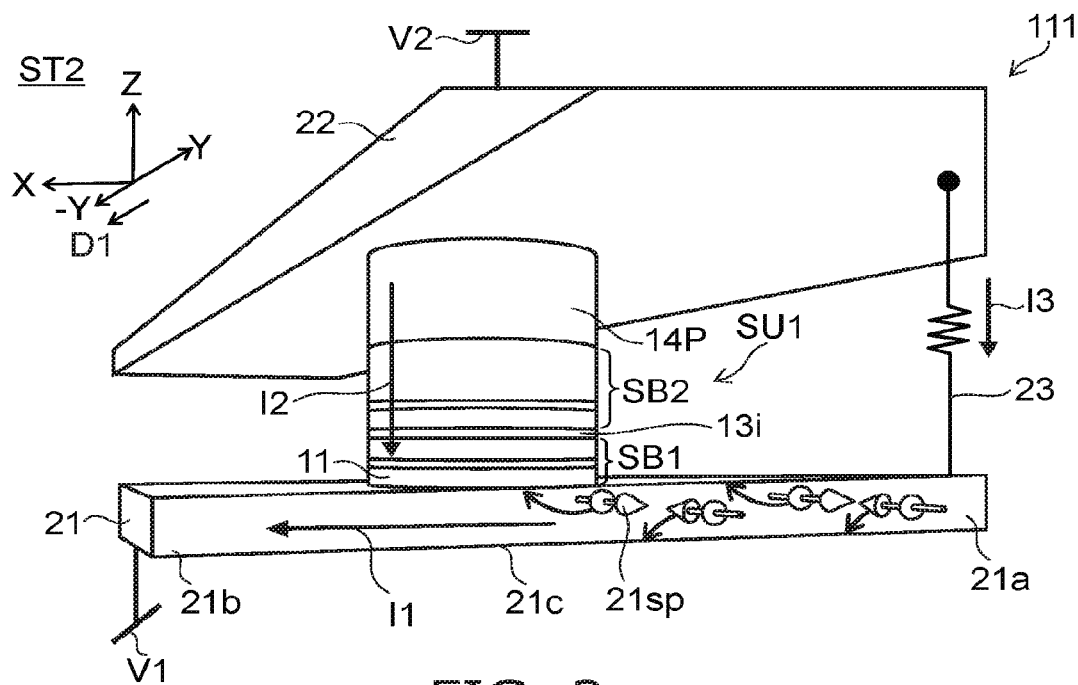
FIG. 2 is a schematic perspective view illustrating the operations of the oscillator according to the first embodiment.

FIG. 2 is a schematic perspective view illustrating the operations of the oscillator according to the first embodiment.

In the second state ST2, a spin-polarized current spin torque is generated in the second magnetization M2 of the second magnetic layer 12. The spin-polarized current spin torque is generated by the current I2 (the current flowing from the third magnetic layer 13 toward the second magnetic layer 12). As described above, in the first state ST1 (the non-conduction state) in the oscillator 111, the second magnetization M2 of the second magnetic layer 12 and the third magnetization M3 of the third magnetic layer 13 are substantially parallel to each other. The spin-polarized current spin torque acts on the second magnetization M2. The spin-polarized current spin torque acts to cause the second magnetization M2 to rotate to the reverse direction of the third magnetization M3. The orientation of the spin-polarized current spin torque is an orientation such that the second magnetization M2 oscillates.

On the other hand, as shown in FIG. 2, the spin Hall torque that is based on the first current I1 acts on the first magnetization M1 of the first magnetic layer 11. The spin Hall torque is generated by a pure spin current 21sp caused by the spin Hall effect generated with the first current I1 flowing in the first conductive body 21.

As described above in the example of the oscillator 111, the first conductive body 21 includes a material (Ta, W, Re, etc.) having a negative spin Hall conductivity. At this time, due to the spin Hall effect, the pure spin current 21sp that has a spin component of the "left-hand orientation" with respect to the first current I1 is generated. Thereby, the pure spin current 21sp that has a magnetic moment in the +Y direction is injected into the first magnetic layer 11. As a result, the spin Hall torque acts in an orientation to cause the first magnetization M1 of the first magnetic layer 11 to rotate in the +Y direction.

As described below, the first conductive body 21 may include a material having a positive spin Hall conductivity. In such a case, the direction of the spin Hall torque is the reverse orientation. Such an example is described below.

Thus, in the second state ST2 in the oscillator 111, for example, the spin Hall torque acts on the first magnetization M1 of the first magnetic layer 11; and, for example, the spin-polarized current spin torque acts on the second magnetization M2 of the second magnetic layer 12. Thereby, the magnetizations oscillate. On the other hand, the third magnetization M3 of the third magnetic layer 13 and the fourth magnetization M4 of the fourth magnetic layer 14 of the second stacked body SB2 are substantially fixed. In the oscillating state, the relative angle between the magnetizations of the first stacked body SB1 and the fixed magnetizations of the second stacked body SB2 changes with time. For example, the relative angle between the third magnetization M3 of the third magnetic layer 13 and the second magnetization M2 of the second magnetic layer 12 changes with time. Due to the magnetoresistance effect, an oscillation component occurs in the electrical resistance of the first stacked unit SU1. For example, the power supply that generates the second potential V2 is a constant voltage source. Therefore, the current (the second current I2) that flows through the first stacked unit SU1 has an alternating current component reflecting the oscillation of the electrical resistance of the first stacked unit SU1. An alternating current component also occurs in the first current I1 flowing in the first conductive body 21 connected to the second conductive body 22 via the third conductive body 23.

Accompanying these alternating current components, alternating current components occur in the spin-polarized current spin torque and the spin Hall torque as well. The spin-polarized current spin torque and the spin Hall torque each have an alternating current component in addition to the direct current component. These spin torques act on the first stacked body SB1.

Such a second state ST2 corresponds to a configuration in which a feedback circuit having a loop configuration is added to the first stacked unit SU1. In this configuration, the alternating current signal that is extracted returns to the first stacked unit SU1. In other words, in the oscillator 111 according to the embodiment, self-feedback of the oscillation occurs in the first stacked body SB1. The oscillations are stabilized by the injection-locking effect of the magnetizations (the first magnetization M1 and the second magnetization M2) of the first stacked body SB1.

In the oscillator 111 according to the embodiment, two types of spin torque act on the magnetizations of the first stacked body SB1 with the self-feedback effect. Thereby, a stable oscillation is obtained.

Thus, in the embodiment, in the second state ST2 (the conduction state), for example, the spin Hall torque acts on the first magnetic layer 11; and the spin torque acts on the second magnetic layer 12 due to the spin-polarized current. Thereby, the magnetizations of the first stacked body SB1 (the synthetic ferri layer) oscillate. A signal that reflects the change of the resistance accompanying the change of the angle (the relative angle) between the magnetizations of the first stacked body SB1 and the magnetizations of the second stacked body SB2 are output from the circuit unit 70. For example, the change of the resistance is based on the magnetoresistance effect.

The following first to fourth reference examples relate to the improvement of the stability of the oscillation in a spin torque oscillator (a Spin-Torque Nano-Oscillator (STNO)).

In the first reference example, the magnetization of a magnetic body having a large volume is caused to oscillate. However, a large spin current is necessary to cause the magnetization of a magnet having a large volume to oscillate. Therefore, the volume increase is limited; and the improvement of the stability of the oscillation is limited. In the second reference example, the oscillation is in conjunction with an external stable signal (injection locking). In the signal input to the STNO in the example, a stable external alternating current is superimposed onto a direct current for causing the magnetization to oscillate. In this method, a stable external alternating current is necessary; and this method is not practical. In the third reference example, the oscillation of the magnetization of the magnetic body is fed back to the magnetic body. However, the stability of the oscillation is insufficient. In the fourth reference example, multiple STNOs are coupled; and synchronous oscillation is performed. Because the multiple STNOs are used, the configuration is complex. Also, the stability of the oscillation is insufficient. In these reference examples, one type of spin injection is performed on a single magnetic layer. Therefore, the stability of the oscillation is insufficient.

Conversely, in the oscillator 111 according to the embodiment, for example, the spin Hall torque acts on the first magnetization M1 of the first magnetic layer 11; and, for example, the spin-polarized current spin torque acts on the second magnetization M2 of the second magnetic layer 12. The two magnetic layers (the first magnetic layer 11 and the second magnetic layer 12) are excited simultaneously based on two types of spin torque. Thereby, a large magnetization oscillation energy is generated. Thereby, a stable oscillation is obtained.

In the oscillator 111, the second region 21b of the first conductive body 21 can be considered to be one terminal. The second conductive body 22 can be considered to be one other terminal. The connection point N23 where the circuit unit 70 is connected can be considered to be one other terminal. Thus, the oscillator 111 can be considered to be a three-terminal type.

In the embodiment, for example, the first magnetic layer 11, the second magnetic layer 12, and the first intermediate layer 11i are provided in the first stacked body SB1 (e.g., the oscillation generation layer). The magnetizations of these magnetic layers are antiparallel to each other. By using two such magnetic layers, the spin Hall torque acts on the first magnetic layer 11; and the spin-polarized current spin torque acts on the second magnetic layer 12. In the novel configuration according to the embodiment, it is possible to use the actions of two types of spin torque. Thereby, the stability of the oscillation can be high compared to conventional art.

In the embodiment as described above, for example, the second magnetization M2 is substantially antiparallel to the first magnetization M1; and the fourth magnetization M4 is substantially antiparallel to the third magnetization M3. The first intermediate layer 11i and the second intermediate layer 12i each are, for example, antiferromagnetic exchange coupling layers. By appropriately setting the materials and thicknesses of these intermediate layers, antiferromagnetic exchange coupling is obtained between the first magnetic layer 11 and the second magnetic layer 12 and between the third magnetic layer 13 and the fourth magnetic layer 14.

In the first state ST1, the first to fourth magnetizations M1 to M4 are aligned with the third direction (the Y direction or the −Y direction). As shown in FIG. 1D to FIG. 1K, these magnetizations may be tilted with respect to the third direction.

Figure 1D:
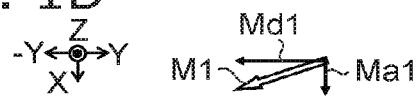
Figure 1F:
Figure 1H:
Figure 1J:
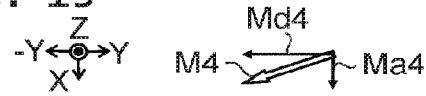
Figure 1E:
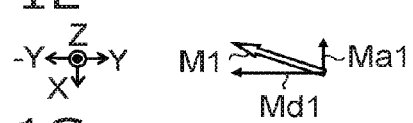

As shown in FIG. 1D and FIG. 1E, in the first state ST1, a component Md1 (the absolute value of the component Md1) in the first orientation D1 of the first magnetization M1 is larger than a component Ma1 (the absolute value of the component Ma1) in the first direction (e.g., the ±X directions) of the first magnetization M1.

Figure 1G:

The second magnetization M2 is substantially antiparallel to the first magnetization M1. Accordingly, as shown in FIG. 1F and FIG. 1G, in the first state ST1, a component Me2 (the absolute value of the component Me2) in the reverse orientation of the first orientation D1 of the second magnetization M2 is larger than a component Ma2 (the absolute value of the component Ma2) in the first direction (e.g., the ±X directions) of the second magnetization M2.

Figure 1I:
Figure 1K:
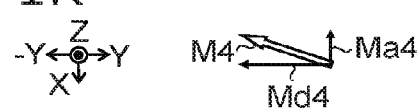

On the other hand, as shown in FIG. 13 and FIG. 1K, in the first state ST1, a component Md4 (the absolute value of the component Md4) in the first orientation D1 of the fourth magnetization M4 is larger than a first-direction component Ma4 (the absolute value of the component Ma4) of the fourth magnetization M4.

The third magnetization M3 is substantially antiparallel to the fourth magnetization M4. Accordingly, as shown in FIG. 1H and FIG. 1I, in the first state ST1, a component Me3 (the absolute value of the component Me3) in the reverse orientation of the first orientation D1 of the third magnetization M3 is larger than a component Ma3 (the absolute value of the component Ma3) in the first direction (e.g., the ±X directions) of the third magnetization M3.

Figure 3:
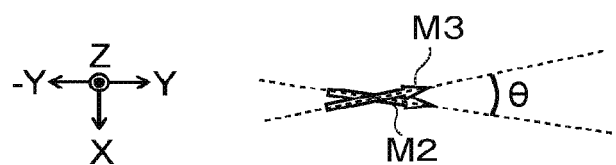
FIG. 3 is a schematic plan view illustrating the oscillator according to the first embodiment.

FIG. 3 is a schematic plan view illustrating the oscillator according to the first embodiment.

In the oscillator 111 as shown in FIG. 3, in the first state ST1, the second magnetization M2 and the third magnetization M3 are substantially parallel to each other. For example, the absolute value of an angle θ between the second magnetization M2 and the third magnetization M3 is less than 45 degrees. In the embodiment, the angle θ may be not less than minus 10 degrees and not more than plus 10 degrees. As described below, in another embodiment, the second magnetization M2 and the third magnetization M3 may be substantially antiparallel to each other. In such a case, the angle θ may be not less than 170 degrees and not more than 190 degrees.

For example, parametric resonance occurs in the case where the second magnetization M2 and the third magnetization M3 are substantially parallel to each other. The oscillation stabilizes further. An example of this state will now be described.

Figure 4:
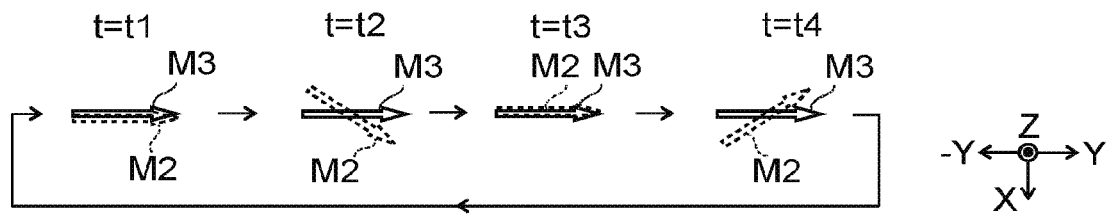
FIG. 4 is a schematic plan view illustrating the oscillator according to the first embodiment.

FIG. 4 is a schematic plan view illustrating the oscillator according to the first embodiment.

In the example as shown in FIG. 4, the third magnetization M3 is fixed in the Y direction. The states in which time t is first to fourth times t1 to t4 are repeated. The direction of the second magnetization M2 changes with time t. In other words, an oscillation is generated. At the first time t1 and the third time t3, the second magnetization M2 is substantially parallel to the third magnetization M3. At the second time t2 and the fourth time t4, the second magnetization M2 is tilted with respect to the third magnetization M3. The first to fourth times t1 to t4 correspond to one period.

Due to the magnetoresistance effect, the resistance of the first stacked unit SU1 changes according to the change of the angle between the second magnetization M2 and the third magnetization M3. The resistance changes two times in the interval of the second magnetization M2 oscillating during the first to fourth times t1 to t4 (one period). Accordingly, the frequency of the alternating current component of the second current I2 flowing through the first stacked unit SU1 and the first current I1 flowing through the first conductive body 21 is 2 times the vibration frequency of the magnetizations of the first stacked body SB1. For example, a self-feedback signal of a frequency of 2 times the vibration frequency of the first stacked body SB1 is injected into the magnetizations of the first stacked body SB1. Thus, for example, the parametric resonance occurs. Thereby, the frequency of the oscillation is more stable.

In the embodiment as described below, there are also cases where the third magnetization M3 is substantially fixed in the −Y direction; and in the first state ST1, the second magnetization M2 and the third magnetization M3 are substantially parallel to each other. In such a case as well, similarly to the example recited above, the parametric resonance occurs.

In the embodiment, the first to fourth magnetic layers 11 to 14 include, for example, Co and Fe. These magnetic layers include, for example, an alloy including Co and Fe (e.g., CoFe, CoFeB, CoMnSi, etc.). The first to fourth magnetic layers 11 to 14 are, for example, ferromagnetic layers.

The second conductive body-side magnetic layer 14P includes, for example, an antiferromagnetic body (e.g., PtMn, IrMn, etc.). For example, the fourth magnetization M4 of the fourth magnetic layer 14 is pinned in the desired direction by the second conductive body-side magnetic layer 14P.

The first intermediate layer 11i and the second intermediate layer 12i include, for example, Ru. The thickness of each of these intermediate layers is, for example, not less than 0.8 nm and not more than 1 nm. For example, the thickness corresponds to the 2nd peak of RKKY (Ruderman-Kittek-Kasuya-Yoshida) coupling. The thickness of each of these intermediate layers may be not less than 0.3 nm and not more than 0.6 nm. For example, the thickness corresponds to the 1st peak of RKKY coupling.

The third intermediate layer 13i is, for example, a non-magnetic layer. The third intermediate layer 13i includes, for example, a metal (e.g., at least one of Cu or Ag). The third intermediate layer 13i may include an insulative material (e.g., at least one of MgO or $Al_2O_3$). In the case where the third intermediate layer 13i includes an insulative material, the thickness of the third intermediate layer 13i is a thickness (e.g., nm or less) such that conductivity is obtained by the tunneling effect.

The first conductive body 21 includes a heavy metal. The first conductive body 21 includes, for example, at least one of Ta, W, or Re. The spin Hall conductivity is negative for these materials. In an example of another embodiment as described below, the first conductive body 21 includes, for example, at least one of Ru, Rh, Pd, Os, or Pt. The spin Hall conductivity is positive for these materials.

At least one of the second conductive body 22 or the third conductive body 23 includes, for example, at least one of Cu or Al, etc.

The magnetic unit 40 (e.g., the first magnetic portion 40a and the second magnetic portion 40b) include, for example, Co and Fe. The magnetic unit 40 includes, for example, an alloy including Co and Fe (e.g., CoFe, CoFeB, CoMnSi, etc.).

The description of the materials recited above is an example; and the embodiment is not limited to the examples of the materials recited above.

In the oscillator 111 as recited above, for example, the first magnetic layer 11 has shape anisotropy. Thereby, the first magnetization M1 of the first magnetic layer 11 is substantially aligned with the third direction (the Y direction or the −Y direction). In the embodiment, the configuration of the first magnetic layer 11 may be isotropic. An example will now be described.

FIG. 5A and FIG. 5B are schematic plan views illustrating other oscillators according to the first embodiment.

These drawings illustrate the configuration of the first stacked unit SU1. The first conductive body 21, the second conductive body 22, the third conductive body 23, the first stacked unit SU1, and the magnetic unit 40 are provided in both the oscillators 111a and 111b shown in FIG. 5A and FIG. 5B. The conductive bodies and the magnetic unit 40 are similar to those of the oscillator 111; and a description is therefore omitted. Other than the planar configuration, the first stacked unit SU1 is similar to that of the oscillator 111; and a description is therefore omitted.

In the oscillator 111a, the first stacked unit SU1 further includes an external magnetic field application portion 18. In the example, the external magnetic field application portion 18 includes a first external magnetic field application portion 18a and a second external magnetic field application portion 18b. For example, the first stacked body SB1 is disposed between the first external magnetic field application portion 18a and the second external magnetic field application portion 18b in the third direction (the Y direction or the −Y direction). The first external magnetic field application portion 18a and the second external magnetic field application portion 18b apply a magnetic field to the first stacked body SB1 along the third direction. Thereby, the first magnetization M1 of the first magnetic layer 11 is substantially aligned with the third direction.

For example, the distance (the distance in the −Y direction or the Y direction) between the first external magnetic field application portion 18a and the first stacked body SB1 and the distance (the distance in the −Y direction or the Y direction) between the second external magnetic field application portion 18b and the first stacked body SB1 each are not more than the width of the first stacked body SB1 (the length L3 along the third direction (the Y direction or the -Y direction)). Thereby, a magnetic field along the third direction is applied effectively to the first stacked body SB1.

In the oscillator 111b, magneto-crystalline anisotropy is provided to the first stacked body SB1. Thereby, the first magnetization M1 is substantially aligned with the third direction even in the case where the configuration of the first stacked body SB1 including the first magnetic layer 11 is isotropic.

Thus, for example, at least one of shape anisotropy, an external magnetic field, or magneto-crystalline anisotropy is used to control the direction of the magnetizations of the first stacked body SB1. Such a configuration of the control of the direction of the magnetizations of the first stacked body SB1 is applicable to examples of the embodiment described below. Although the case is described where an external magnetic field is used, other configurations are applicable.

In the embodiment, the second magnetization M2 is substantially antiparallel to the first magnetization M1; and the fourth magnetization M4 is substantially antiparallel to the third magnetization M3. As described above, a first orientation D1 is the orientation of the current magnetic field Hi generated in the space Sp1 when a current is caused to flow in the first conductive body 21 from the first region 21a toward the second region 21b.

In the examples of the oscillators 111, 111a, and 111b, in the first state ST1, the orientations of the first magnetization M1 and the fourth magnetization M4 are the first orientation D1. In other words, in the first state ST1, the component Md1 in the first orientation D1 of the first magnetization M1 is larger than the first-direction component Ma1 of the first magnetization M1; and the component in the first orientation D1 of the fourth magnetization M4 is larger than the first-direction component Ma4 of the fourth magnetization M4. In the example of the oscillator 111, the first conductive body 21 includes a material having a negative spin Hall conductivity (e.g., Ta, W, Re, etc.). The first magnetic moment MT1 of the first magnetic layer 11 is smaller than the second magnetic moment MT2 of the second magnetic layer 12. In such a case, the magnetic unit magnetic field Hex has the orientation of the second magnetization M2.

Another example according to the embodiment will now be described.

FIG. 6A and FIG. 6B are schematic views illustrating another oscillator according to the first embodiment.

FIG. 6A is a perspective view. FIG. 6B is a cross-sectional view.

As shown in FIG. 6A, the other oscillator 112 according to the embodiment also includes the first conductive body 21, the second conductive body 22, the third conductive body 23, the first stacked unit SU1, and the magnetic unit 40. In the oscillator 112, the first magnetic moment MT1 of the first magnetic layer 11 is larger than the second magnetic moment MT2 of the second magnetic layer 12. The magnetic unit magnetic field Hex in the space Sp1 generated from the magnetic unit 40 has the orientation of the first magnetization M1. Otherwise, the oscillator 112 is similar to the oscillator 111.

In the oscillator 112 as well, the first conductive body 21 includes a material having a negative spin Hall conductivity (e.g., Ta, W, Re, etc.). The orientation (the first orientation D1) of the current magnetic field Hi generated in the space Sp1 when a current is caused to flow in the first conductive body 21 from the first region 21a toward the second region 21b is the -Y direction.

As shown in FIG. 6B, in the first state ST1, the first magnetization M1 and the fourth magnetization M4 have the first orientation D1 (the -Y direction). On the other hand, the second magnetization M2 and the third magnetization M3 have the reverse orientation of the first orientation D1. For example, as described in reference to FIG. 1D and FIG. 1E, in the first state ST1, the component Md1 (the absolute value of the component Md1) in the first orientation D1 (in the example, the -Y direction) of the first magnetization M1 is larger than the component Ma1 (the absolute value of the component Ma1) in the first direction (in the example, the X direction) of the first magnetization M1. In the first state ST1, the component Md4 (the absolute value of the component Md4) in the first orientation D1 of the fourth magnetization M4 is larger than the first-direction component Ma4 (the absolute value of the component Ma4) of the fourth magnetization M4.

In the oscillator 112 as well, for example, the two types of spin torque of the action of the spin Hall torque and the action of the spin-polarized current spin torque are utilized. Thereby, a stable oscillation is obtained.

FIG. 7A to FIG. 7K are schematic views illustrating another oscillator according to the first embodiment.

FIG. 7A is a perspective view. FIG. 7B is a cross-sectional view. FIG. 7C is a plan view. FIG. 7D to FIG. 7K are plan views illustrating the magnetizations.

As shown in FIG. 7A, the other oscillator 113 according to the embodiment also includes the first conductive body 21, the second conductive body 22, the third conductive body 23, the first stacked unit SU1, and the magnetic unit 40. In the oscillator 113, the first conductive body 21 includes a material having a positive spin Hall conductivity. For example, the first conductive body 21 includes at least one of Ru, Rh, Pd, Os, or Pt. Otherwise, the oscillator 113 is similar to the oscillator 111.

In the oscillator 113, the first magnetic moment MT1 of the first magnetic layer 11 is smaller than the second magnetic moment MT2 of the second magnetic layer 12. The magnetic unit magnetic field Hex in the space Sp1 generated from the magnetic unit 40 has the orientation of the second magnetization M2 (in the example, the -Y direction).

In the oscillator 113, the current magnetic field Hi that is generated in the space Sp1 between the third region 21c and the portion 22p when a current is caused to flow in the first conductive body 21 from the first region 21a toward the second region 21b has the first orientation D1 along the third direction. In the example, the first orientation D1 is the -Y direction. In such a case, in the first state ST1, the second magnetization M2 and the third magnetization M3 have the first orientation D1.

In other words, in the first state ST1 as shown in FIG. 7F and FIG. 7G, a component Md2 (the absolute value of the component Md2) in the first orientation D1 of the second magnetization M2 is larger than the first-direction component Ma2 (the absolute value of the component Ma2) of the second magnetization M2. In the first state ST1 as shown in FIG. 7H and FIG. 7I, a component Md3 (the absolute value of the component Md3) in the first orientation D1 of the third magnetization M3 is larger than the first-direction component Ma3 (the absolute value of the component Ma3) of the third magnetization M3. The first magnetization M1 is substantially antiparallel to the second magnetization M2. In the first state ST1 as shown in FIG. 7D and FIG. 7F, a component Me1 (the absolute value of the component Me1) in the reverse orientation of the first orientation D1 of the first magnetization M1 is larger than the first-direction component Ma1 (the absolute value of the component Ma1) of the first magnetization M1. The fourth magnetization M4 is substantially antiparallel to the third magnetization M3. In the first state ST1 as shown in FIG. 7J and FIG. 7K, a component Me4 (the absolute value of the component Me4) in the reverse orientation of the first orientation D1 of the fourth magnetization M4 is larger than the first-direction component Ma4 (the absolute value of the component Ma4) of the fourth magnetization M4.

In the oscillator 113 as described above, the first conductive body 21 includes a material having a positive spin Hall conductivity. In such a case, the orientation of the pure spin current is different from that of the case where a material having a negative spin Hall conductivity is used as the first conductive body 21. In the case of a material having a positive spin Hall conductivity, the orientation of the spin of the pure spin current is the reverse of the state described using FIG. 2. The spin Hall torque acts in an orientation to cause the first magnetization M1 of the first magnetic layer 11 to rotate in the −Y direction. The orientation corresponds to the orientation in which the first magnetization M1 oscillates. The oscillation is obtained by setting the orientation of the external magnetic field (the magnetic unit magnetic field Hex) to be the reverse of that of the oscillator 111. In the embodiment, the orientation of the acting spin torque is an appropriate orientation for which the magnetization oscillation is obtained.

In the oscillator 113 as well, for example, the two types of spin torque of the action of the spin Hall torque and the action of the spin-polarized current spin torque are utilized. Thereby, a stable oscillation is obtained.

As shown in FIG. 7C, in the oscillator 113 as well, the length L3 along the third direction (the Y direction or the −Y direction) of the first magnetic layer 11 is not less than the length L1 along the first direction (the X direction) of the first magnetic layer 11. The length L3 may be longer than the length L1. For example, due to the shape anisotropy, the first magnetization M1 of the first magnetic layer 11 in the first state ST1 is substantially aligned with the third direction.

Figure 8A:
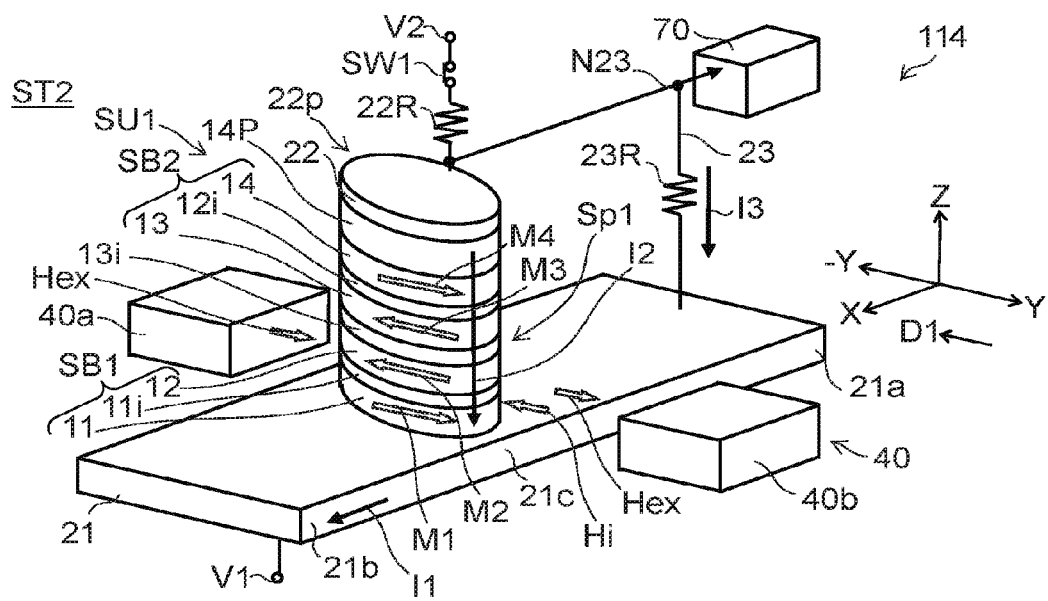
FIG. 8A and FIG. 8B are schematic views illustrating another oscillator according to the first embodiment.
Figure 8B:
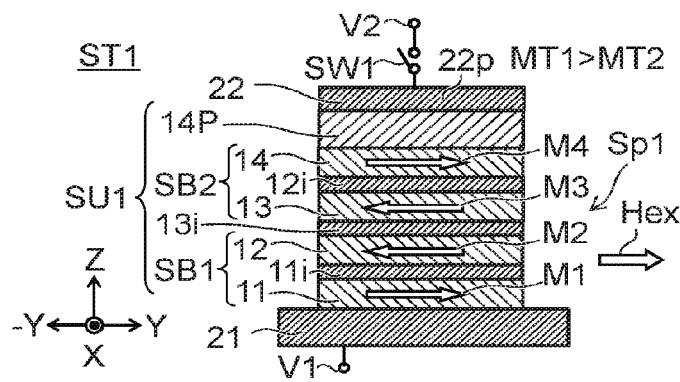

FIG. 8A and FIG. 8B are schematic views illustrating another oscillator according to the first embodiment.

FIG. 8A is a perspective view. FIG. 8B is a cross-sectional view.

As shown in FIG. 8A, the other oscillator 114 according to the embodiment also includes the first conductive body 21, the second conductive body 22, the third conductive body 23, the first stacked unit SU1, and the magnetic unit 40. In the oscillator 114, the first magnetic moment MT1 of the first magnetic layer 11 is larger than the second magnetic moment MT2 of the second magnetic layer 12. The magnetic unit magnetic field Hex in the space Sp1 generated from the magnetic unit 40 has the orientation of the first magnetization M1. Otherwise, the oscillator 114 is similar to the oscillator 113.

In the oscillator 114 as well, the first conductive body 21 includes a material having a positive spin Hall conductivity (e.g., Ru, Rh, Pd, Os, Pt, etc.). The orientation (the first orientation D1) of the current magnetic field Hi generated in the space Sp1 when a current is caused to flow in the first conductive body 21 from the first region 21a toward the second region 21b is the −Y direction.

In the first state ST1 as shown in FIG. 8B, the second magnetization M2 and the third magnetization M3 have the first orientation D1 (the −Y direction). On the other hand, the first magnetization M1 and the fourth magnetization M4 have the reverse orientation of the first orientation D1 (the Y direction). For example, in the first state ST1 as described in reference to FIG. 7F and FIG. 7G, the component Md2 (the absolute value of the component Md2) in the first orientation D1 (in the example, the −Y direction) of the second magnetization M2 is larger than the component Ma2 (the absolute value of the component Ma2) in the first direction (in the example, the X direction) of the second magnetization M2. In the first state ST1, the component Md3 (the absolute value of the component Md3) in the first orientation D1 of the third magnetization M3 is larger than the first-direction component Ma3 (the absolute value of the component Ma3) of the third magnetization M3.

In the oscillator 114 as well, for example, the two types of spin torque of the action of the spin Hall torque and the action of the spin-polarized current spin torque are utilized. Thereby, a stable oscillation is obtained.

Second Embodiment

FIG. 9A to FIG. 9K are schematic views illustrating an oscillator according to a second embodiment.

FIG. 9A is a perspective view. FIG. 9B is a cross-sectional view. FIG. 9C is a plan view. FIG. 9D to FIG. 9K are plan views illustrating the magnetizations.

As shown in FIG. 9A, the oscillator 121 according to the embodiment includes the first conductive body 21, the second conductive body 22, the third conductive body 23, and the first stacked unit SU1. In other words, in the oscillator 121, the magnetic unit 40 that is provided in the oscillator 111 is omitted. In the oscillator 121, a magnetic field H2 (e.g., a leakage magnetic field) that is generated from the second stacked body SB2 acts on the first stacked body SB1 instead of the external magnetic field (the magnetic unit magnetic field Hex) applied by the magnetic unit 40. In the oscillator 121, the first magnetic moment MT1 of the first magnetic layer 11 is smaller than the second magnetic moment MT2 of the second magnetic layer 12. A third magnetic moment MT3 of the third magnetic layer 13 is smaller than a fourth magnetic moment MT4 of the fourth magnetic layer 14. Otherwise, the oscillator 121 is similar to the oscillator 111.

In the first state ST1 as shown in FIG. 9B, the first to fourth magnetizations M1 to M4 are aligned with the third direction. The third direction is perpendicular to the first direction (the X direction) and the second direction (the Z direction). The third direction is the −Y direction or the Y direction.

The second magnetization M2 has a component in the reverse orientation of the first magnetization M1; and the fourth magnetization M4 has a component in the reverse orientation of the third magnetization M3. For example, the second magnetization M2 is antiparallel to the first magnetization M1. For example, the fourth magnetization M4 is antiparallel to the third magnetization M3.

As shown in FIG. 9A, the current magnetic field Hi that is generated in the space Sp1 between the third region 21c and the portion 22p when a current is caused to flow in the first conductive body 21 from the first region 21a toward the second region 21b has the first orientation D1 along the third direction. In the example, the first orientation D1 is the −Y direction.

In the first state ST1, the first magnetization M1 and the fourth magnetization M4 are the first orientation D1 (the −Y direction). For example, in the first state ST1 as shown in FIG. 9D and FIG. 9E, the component Md1 (the absolute value of the component Md1) in the first orientation D1 (in the example, the −Y direction) of the first magnetization M1 is larger than the component Ma1 (the absolute value of the component Ma1) in the first direction (in the example, the X direction) of the first magnetization M1. In the first state ST1 as shown in FIG. 9J and FIG. 9K, the component Md4 (the absolute value of the component Md4) in the first orientation D1 of the fourth magnetization M4 is larger than the first-direction component Ma4 (the absolute value of the component Ma4) of the fourth magnetization M4. On the other hand, in the first state ST1 as shown in FIG. 9F and FIG. 9G, the component Me2 (the absolute value of the component Me2) in the reverse orientation of the first orientation D1 of the second magnetization M2 is larger than the first-direction component Ma2 (the absolute value of the component Ma2) of the second magnetization M2. In the first state ST1 as shown in FIG. 9H and FIG. 9I, the component Me3 (the absolute value of the component Me3) in the reverse orientation of the first orientation D1 of the third magnetization M3 is larger than the first-direction component Ma3 (the absolute value of the component Ma3) of the third magnetization M3.

In the oscillator 121, similarly to the oscillator 111, the first conductive body 21 includes at least one of Ta, W, or Re. The first conductive body 21 includes, for example, a material having a negative spin Hall conductivity.

In the oscillator 121 as described above, the first magnetic moment MT1 of the first magnetic layer 11 is smaller than the second magnetic moment MT2 of the second magnetic layer 12; and the third magnetic moment MT3 of the third magnetic layer 13 is smaller than the fourth magnetic moment MT4 of the fourth magnetic layer 14. The magnetic field H2 that is generated from the second stacked body SB2 and applied to the first stacked body SB1 has the orientation of the second magnetization M2. The magnetic field H2 of the oscillator 121 has the same orientation as the orientation of the external magnetic field (the magnetic unit magnetic field Hex) applied by the magnetic unit 40 in the oscillator 111.

In the oscillator 121 as well, for example, the two types of spin torque of the action of the spin Hall torque and the action of the spin-polarized current spin torque are utilized. Thereby, a stable oscillation is obtained.

As shown in FIG. 9C, in the oscillator 121 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 10A:
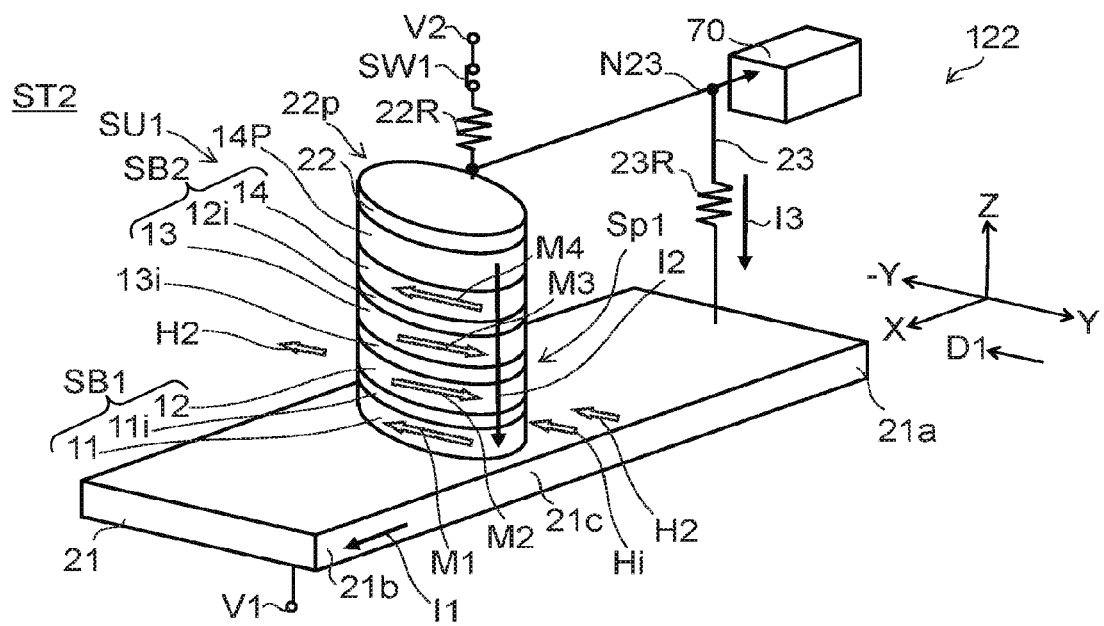
FIG. 10A and FIG. 10B are schematic views illustrating another oscillator according to the second embodiment.
Figure 10B:
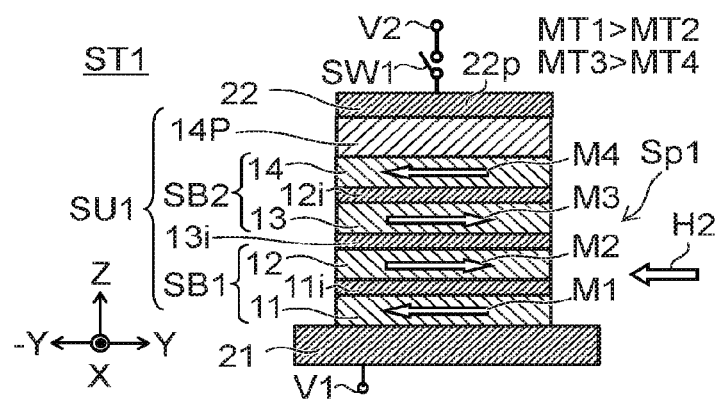

FIG. 10A and FIG. 10B are schematic views illustrating another oscillator according to the second embodiment.

FIG. 10A is a perspective view. FIG. 10B is a cross-sectional view.

As shown in FIG. 10A, the oscillator 122 according to the embodiment also includes the first conductive body 21, the second conductive body 22, the third conductive body 23, and the first stacked unit SU1. The magnetic unit 40 is omitted from the oscillator 122 as well. In the oscillator 122, the first magnetic moment MT1 of the first magnetic layer 11 is larger than the second magnetic moment MT2 of the second magnetic layer 12; and the third magnetic moment MT3 of the third magnetic layer 13 is larger than the fourth magnetic moment MT4 of the fourth magnetic layer 14. Otherwise, the oscillator 122 according to the embodiment is similar to the oscillator 121.

In the oscillator 122 as well, in the first state ST1 as shown in FIG. 10B, the first to fourth magnetizations M1 to M4 are aligned with the third direction. The third direction is perpendicular to the first direction (the X direction) and the second direction (the Z direction). The third direction is the −Y direction or the Y direction. In the first state ST1, the first magnetization M1 and the fourth magnetization M4 are the first orientation D1 (the −Y direction). The magnetic field H2 that is generated from the second stacked body SB2 and applied to the first stacked body SB1 has the orientation of the first magnetization M1.

In the oscillator 122 as well, for example, the two types of spin torque of the action of the spin Hall torque and the action of the spin-polarized current spin torque are utilized. Thereby, a stable oscillation is obtained.

In the oscillators 121 and 122, the first conductive body 21 includes, for example, a material having a negative spin Hall conductivity. In such a case, the first stacked body SB1 satisfies one of a first condition (the condition of the oscillator 121) or a second condition (the condition of the oscillator 122) in the first state ST1. In the first condition, the first magnetic moment MT1 is smaller than the second magnetic moment MT2; and the third magnetic moment MT3 is smaller than the fourth magnetic moment MT4. In the second condition, the first magnetic moment MT1 is larger than the second magnetic moment MT2; and the third magnetic moment MT3 is larger than the fourth magnetic moment MT4.

FIG. 11A to FIG. 11K are schematic views illustrating another oscillator according to the second embodiment.

Figure 11A:
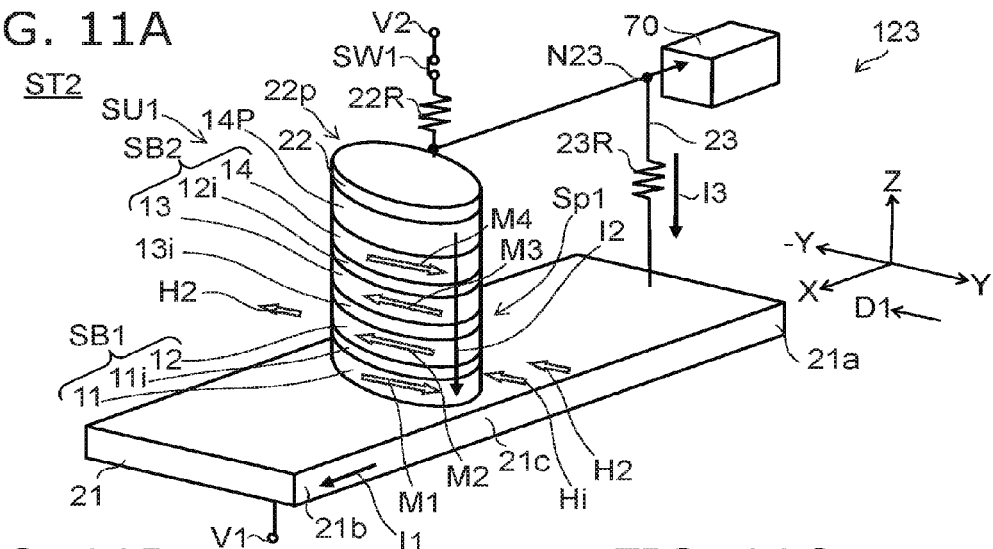
FIG. 11A to FIG. 11K are schematic views illustrating another oscillator according to the second embodiment.
Figure 11B:
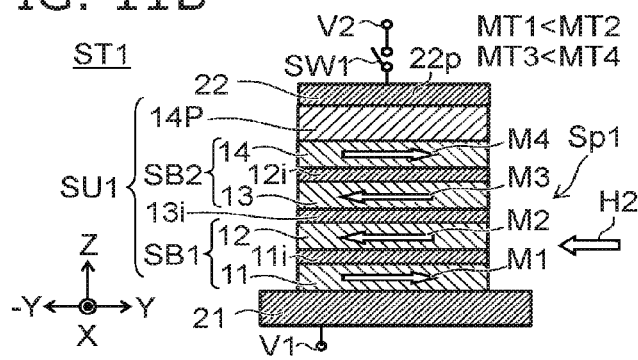
Figure 11C:
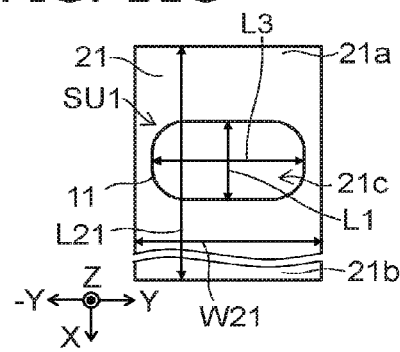

FIG. 11A is a perspective view. FIG. 11B is a cross-sectional view. FIG. 11C is a plan view. FIG. 11D to FIG. 11K are plan views illustrating the magnetizations.

As shown in FIG. 11A, the oscillator 123 according to the embodiment also includes the first conductive body 21, the second conductive body 22, the third conductive body 23, and the first stacked unit SU1. In the example as well, the magnetic field H2 that is generated from the second stacked body SB2 is applied to the first stacked body SB1. In the oscillator 123, the first conductive body 21 includes a material having a positive spin Hall conductivity (e.g., Ru, Rh, Pd, Os, Pt, etc.). Otherwise, the oscillator 123 is similar to the oscillator 121. In other words, in the oscillator 123 as well, similarly to the oscillator 121, the first magnetic moment MT1 of the first magnetic layer 11 is smaller than the second magnetic moment MT2 of the second magnetic layer 12. The third magnetic moment MT3 of the third magnetic layer 13 is smaller than the fourth magnetic moment MT4 of the fourth magnetic layer 14.

As shown in FIG. 11B, in the oscillator 123 as well, in the first state ST1, the first to fourth magnetizations M1 to M4 are aligned with the third direction (the −Y direction or the Y direction) perpendicular to the first direction (the X direction) and the second direction (the Z direction). The second magnetization M2 has a component in the reverse orientation of the first magnetization M1. The fourth magnetization M4 has a component in the reverse orientation of the third magnetization M3.

As shown in FIG. 11A, the current magnetic field Hi that is generated in the space Sp1 between the third region 21c and the portion 22p when a current is caused to flow in the first conductive body 21 from the first region 21a toward the second region 21b has the first orientation D1 along the third direction. In the example, the first orientation D1 is the −Y direction.

Figure 11D:
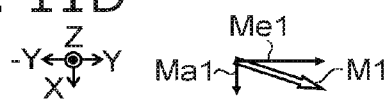
Figure 11E:
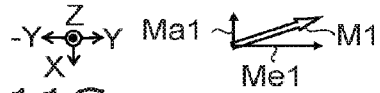
Figure 11F:
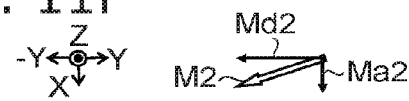
Figure 11G:
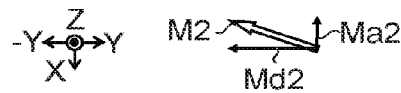
Figure 11H:
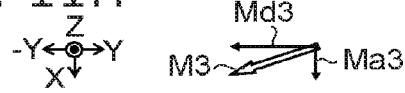
Figure 11I:
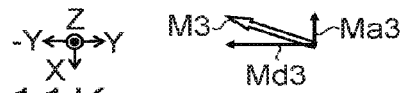
Figure 11J:
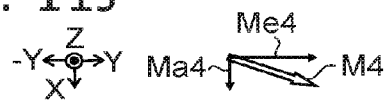
Figure 11K:
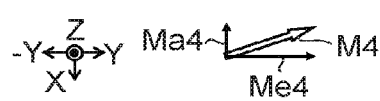

In the first state ST1, the second magnetization M2 and the third magnetization M3 have the first orientation D1 (the −Y direction). In the first state ST1 as shown in FIG. 11F and FIG. 11G, the component Md2 (the absolute value of the component Md2) in the first orientation D1 of the second magnetization M2 is larger than the first-direction component Ma2 (the absolute value of the component Ma2) of the second magnetization M2. In the first state ST1 as shown in FIG. 11H and FIG. 11I, the component Md3 (the absolute value of the component Md3) in the first orientation D1 of the third magnetization M3 is larger than the first-direction component Ma3 (the absolute value of the component Ma3) of the third magnetization M3. On the other hand, in the first state ST1 as shown in FIG. 11D and FIG. 11E, the component Me1 (the absolute value of the component Me1) in the reverse orientation of the first orientation D1 of the first magnetization M1 is larger than the first-direction component Ma1 (the absolute value of the component Ma1) of the first magnetization M1. In the first state ST1 as shown in FIG. 11J and FIG. 11K, the component Me4 (the absolute value of the component Me4) in the reverse orientation of the first orientation D1 of the fourth magnetization M4 is larger than the first-direction component Ma4 (the absolute value of the component Ma4) of the fourth magnetization M4.

The magnetic field H2 that is generated from the second stacked body SB2 and applied to the first stacked body SB1 has the orientation of the second magnetization M2.

In the oscillator 123 as well, for example, the two types of spin torque of the action of the spin Hall torque and the action of the spin-polarized current spin torque are utilized. Thereby, a stable oscillation is obtained.

As shown in FIG. 11C, in the oscillator 123 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 12A:
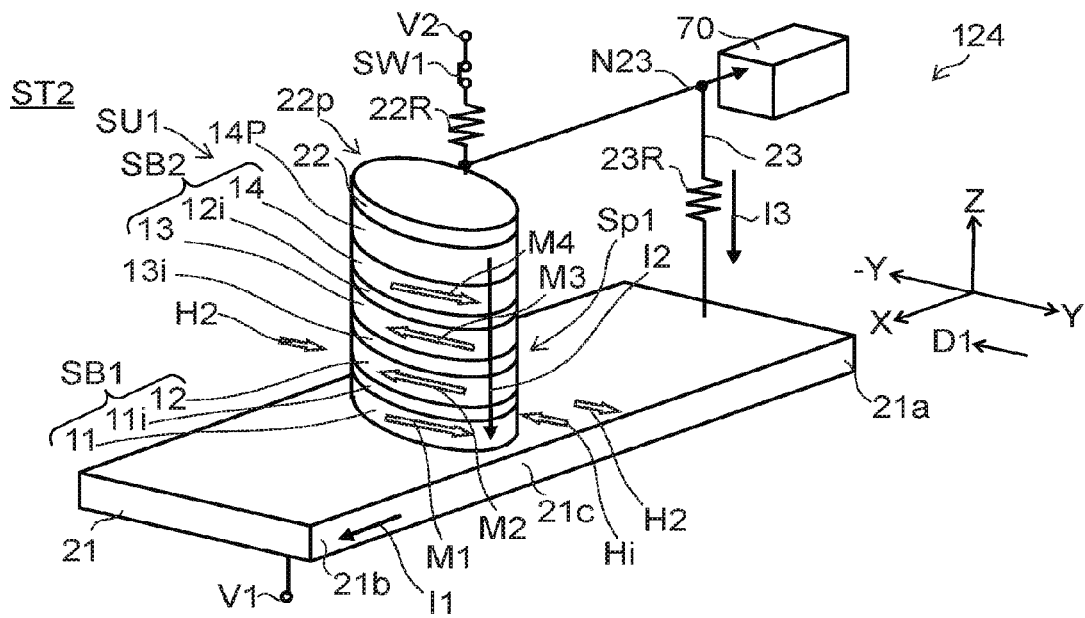
FIG. 12A and FIG. 12B are schematic views illustrating another oscillator according to the second embodiment.
Figure 12B:
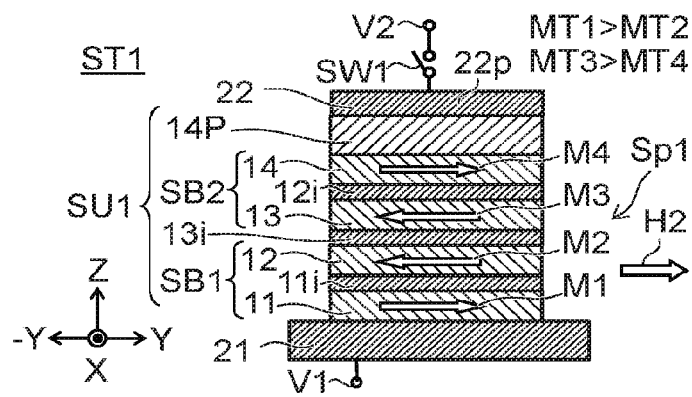

FIG. 12A and FIG. 12B are schematic views illustrating another oscillator according to the second embodiment.

FIG. 12A is a perspective view. FIG. 12B is a cross-sectional view.

As shown in FIG. 12A, the oscillator 124 according to the embodiment also includes the first conductive body 21, the second conductive body 22, the third conductive body 23, and the first stacked unit SU1. The magnetic unit 40 is omitted from the oscillator 124 as well. In the oscillator 124, the first magnetic moment MT1 of the first magnetic layer 11 is larger than the second magnetic moment MT2 of the second magnetic layer 12; and the third magnetic moment MT3 of the third magnetic layer 13 is larger than the fourth magnetic moment MT4 of the fourth magnetic layer 14. Otherwise, the oscillator 124 is similar to the oscillator 123.

The magnetic field H2 that is generated from the second stacked body SB2 and applied to the first stacked body SB1 has the orientation of the first magnetization M1.

In the oscillator 124 as well, for example, the two types of spin torque of the action of the spin Hall torque and the action of the spin-polarized current spin torque are utilized. Thereby, a stable oscillation is obtained.

In the oscillators 123 and 124, the first conductive body 21 includes, for example, a material having a positive spin Hall conductivity. In such a case, the first stacked body SB1 satisfies one of the first condition (the condition of the oscillator 123) or the second condition (the condition of the oscillator 124) in the first state ST1. In the first condition, the first magnetic moment MT1 is smaller than the second magnetic moment MT2; and the third magnetic moment MT3 is smaller than the fourth magnetic moment MT4. In the second condition, the first magnetic moment MT1 is larger than the second magnetic moment MT2; and the third magnetic moment MT3 is larger than the fourth magnetic moment MT4.

In the oscillators 111a, 111b, 112 to 114, and 121 to 124, the angle θ between the second magnetization M2 and the third magnetization M3 (referring to FIG. 3) may be not less than minus 10 degrees and not more than plus 10 degrees. For example, the parametric resonance occurs. The oscillation stabilizes further.

Third Embodiment

In the embodiment, the orientation of the second current I2 flowing through the first stacked unit SU1 is the reverse of that of the first embodiment.

FIG. 13A to FIG. 13K are schematic views illustrating the oscillator according to the third embodiment.

Figure 13A:
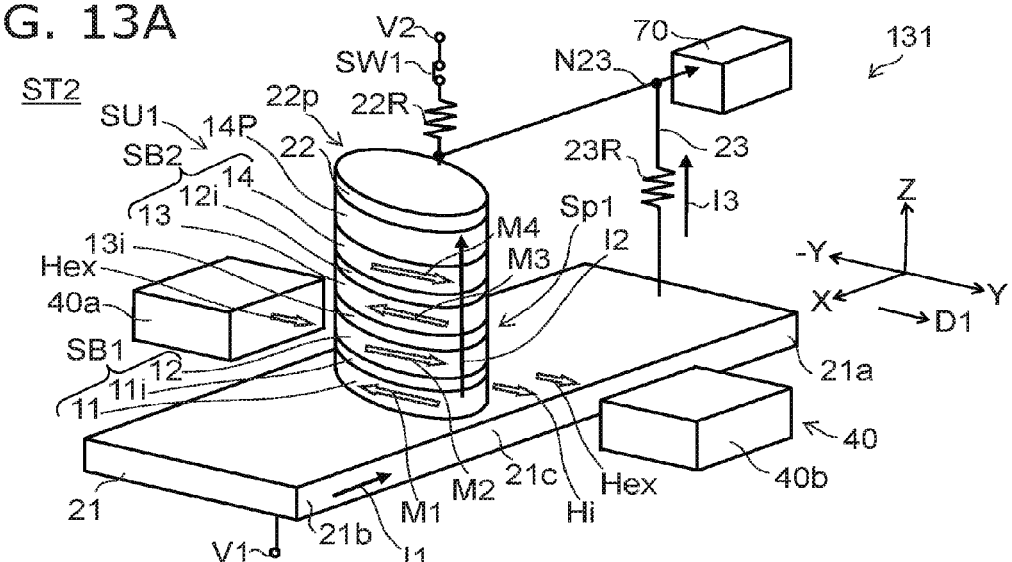
FIG. 13A to FIG. 13K are schematic views illustrating the oscillator according to the third embodiment.
Figure 13B:
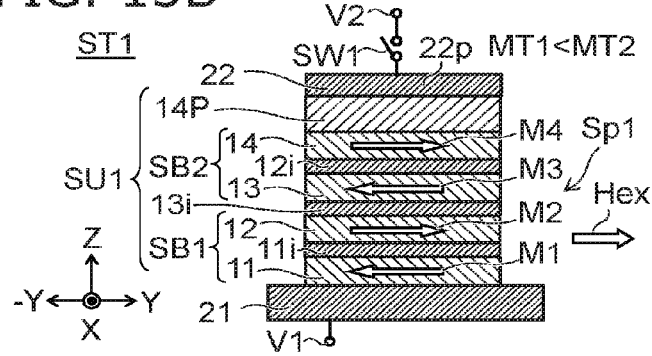
Figure 13C:
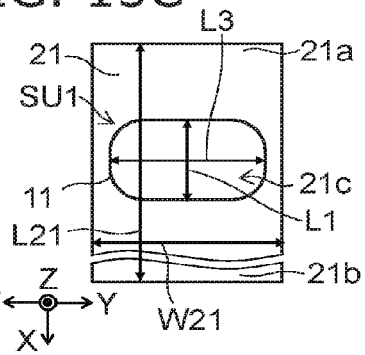

FIG. 13A is a perspective view. FIG. 13B is a cross-sectional view. FIG. 13C is a plan view. FIG. 13D to FIG. 13K are plan views illustrating the magnetizations.

As shown in FIG. 13A, the oscillator 131 according to the embodiment includes the first conductive body 21, the second conductive body 22, the third conductive body 23, the first stacked unit SU1, and the magnetic unit 40.

The configurations of the first to third conductive bodies 21 to 23 are similar to those of the oscillator 111. In the example as well, the first stacked unit SU1 includes the first to fourth magnetic layers 11 to 14 and the first to third intermediate layers 11i to 13i.

In the first state ST1 as shown in FIG. 13B, the first to fourth magnetizations M1 to M4 are aligned with the third direction perpendicular to the first direction (the X direction) and the second direction (the Z direction). The third direction is the −Y direction or the Y direction. The second magnetization M2 has a component in the reverse orientation of the first magnetization M1; and the fourth magnetization M4 has a component in the reverse orientation of the third magnetization M3. For example, the second magnetization M2 is antiparallel to the first magnetization M1; and the fourth magnetization M4 is antiparallel to the third magnetization M3. In the oscillator 131, the third magnetization M3 in the first state ST1 is substantially antiparallel to the second magnetization M2.

For example, the angle θ of the second magnetization M2 and the third magnetization M3 (referring to FIG. 3) is not less than 135 degrees and not more than 225 degrees. The angle θ may be not less than 170 degrees and not more than 190 degrees.

In the example of the oscillator 131, the first conductive body 21 includes a material having a positive spin Hall conductivity. For example, the first conductive body 21 includes at least one of Ru, Rh, Pd, Os, or Pt.

The current magnetic field Hi that is generated in the space Sp1 between the third region 21c and the portion 22p when a current is caused to flow in the first conductive body 21 from the second region 21b toward the first region 21a has the first orientation D1 along the third direction. In the oscillator 131, the first orientation D1 is, for example, the Y direction.

In the first state, for example, the second magnetization M2 and the fourth magnetization M4 have the first orientation D1; and, for example, the first magnetization M1 and the third magnetization M3 have the reverse orientation of the first orientation D1 (the −Y direction).

Figure 13D:
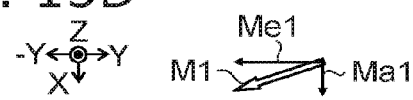
Figure 13E:
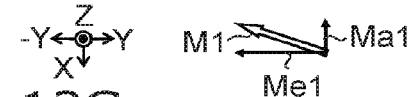
Figure 13F:
Figure 13G:
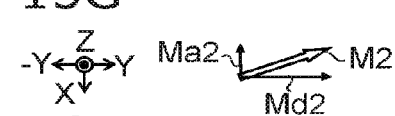
Figure 13H:
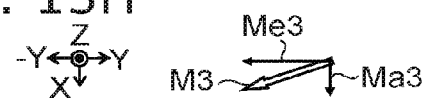
Figure 13I:
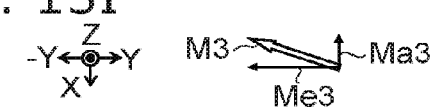
Figure 13J:
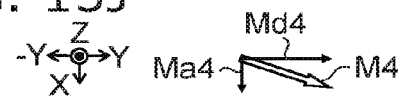
Figure 13K:
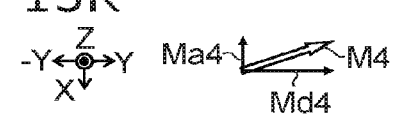

For example, in the first state ST1 as shown in FIG. 13F and FIG. 13G, the component Md2 (the absolute value of the component Md2) in the first orientation D1 of the second magnetization M2 is larger than the first-direction component Ma2 (the absolute value of the component Ma2) of the second magnetization M2. In the first state ST1 as shown in FIG. 13J and FIG. 13K, the component Md4 (the absolute value of the component Md4) in the first orientation D1 of the fourth magnetization M4 is larger than the first-direction component Ma4 (the absolute value of the component Ma4) of the fourth magnetization M4. On the other hand, in the first state ST1 as shown in FIG. 13D and FIG. 13E, the component Me1 (the absolute value of the component Me1) in the reverse orientation of the first orientation D1 of the first magnetization M1 is larger than the first-direction component Ma2 (the absolute value of the component Ma2) of the first magnetization M1. In the first state ST1 as shown in FIG. 13H and FIG. 13I, the component Me3 (the absolute value of the component Me3) in the reverse orientation of the first orientation D1 of the third magnetization M3 is larger than the first-direction component Ma3 (the absolute value of the component Ma3) of the third magnetization M3.

In the oscillator 131, the first magnetic moment MT1 of the first magnetic layer 11 is smaller than the second magnetic moment MT2 of the second magnetic layer 12. The magnetic unit magnetic field Hex in the space Sp1 generated from the magnetic unit 40 has the orientation of the second magnetization M2.

As shown in FIG. 13A, the second state ST2 is formed in the oscillator 131. The second region 21b is set to the first potential V1; and the second conductive body 22 is set to the second potential V2. The second potential V2 is lower than the first potential V1.

In the second state ST2, the first current I1 flows from the second region 21b toward the first region 21a. The second current I2 flows from the first magnetic layer 11 toward the fourth magnetic layer 14. The third current I3 flows through the third conductive body 23 from the first region 21a toward the second conductive body 22. In the second state ST2, the connection point N23 that is connected to the second conductive body 22 and the third conductive body 23 oscillates.

For example, in the second state ST2, for example, the spin Hall torque acts on the first magnetization M1 of the first magnetic layer 11 based on the first current I1. On the other hand, for example, the spin-polarized current spin torque acts on the second magnetization M2 of the second magnetic layer 12 based on the second current I2. In the oscillator 131 as well, the two types of spin torque of the action of the spin Hall torque and the action of the spin-polarized current spin torque are utilized. Thereby, a stable oscillation is obtained.

As shown in FIG. 13C, in the oscillator 131 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 14A:
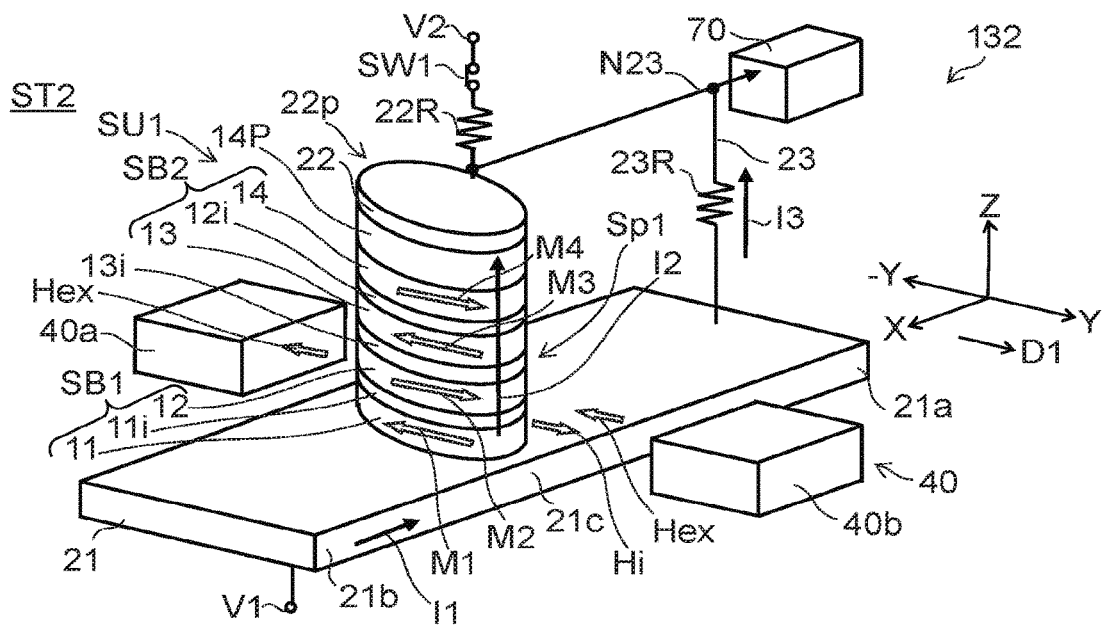
FIG. 14A and FIG. 14B are schematic views illustrating another oscillator according to the third embodiment.
Figure 14B:
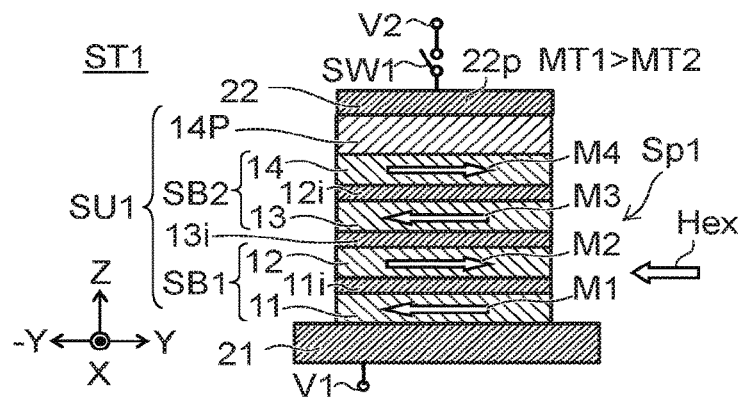

FIG. 14A and FIG. 14B are schematic views illustrating another oscillator according to the third embodiment.

FIG. 14A is a perspective view. FIG. 14B is a cross-sectional view.

As shown in FIG. 14A, the other oscillator 132 according to the embodiment also includes the first conductive body 21, the second conductive body 22, the third conductive body 23, the first stacked unit SU1, and the magnetic unit 40. In the oscillator 112, the first magnetic moment MT1 of the first magnetic layer 11 is larger than the second magnetic moment MT2 of the second magnetic layer 12. The magnetic unit magnetic field Hex in the space Sp1 generated from the magnetic unit 40 has the orientation of the first magnetization M1. Otherwise, the oscillator 132 is similar to the oscillator 131.

In the oscillator 132 as well, the first conductive body 21 includes a material having a positive spin Hall conductivity (e.g., Ru, Rh, Pd, Os, Pt, etc.). The orientation (the first orientation D1) of the current magnetic field Hi generated in the space Sp1 when a current is caused to flow in the first conductive body 21 from the second region 21b toward the first region 21a is the Y direction.

In the first state ST1 as shown in FIG. 14B, the second magnetization M2 and the fourth magnetization M4 have the first orientation D1 (the −Y direction). On the other hand, the first magnetization M1 and the third magnetization M3 have the reverse orientation of the first orientation D1. For example, in the first state ST1 as described in reference to FIG. 14F and FIG. 14G, the component Md2 (the absolute value of the component Md2) in the first orientation D1 (in the example, the −Y direction) of the second magnetization M2 is larger than the component Ma2 (the absolute value of the component Ma2) in the first direction (in the example, the X direction) of the second magnetization M2. In the first state ST1, the component Md4 (the absolute value of the component Md4) in the first orientation D1 of the fourth magnetization M4 is larger than the first-direction component Ma4 (the absolute value of the component Ma4) of the fourth magnetization M4.

In the oscillator 132 as well, for example, the two types of spin torque of the action of the spin Hall torque and the action of the spin-polarized current spin torque are utilized. Thereby, a stable oscillation is obtained.

In the oscillators 131 and 132 recited above, as described above, the first conductive body 21 includes a material having a positive spin Hall conductivity (e.g., Ru, Rh, Pd, Os, Pt, etc.). In such a case, the first stacked body SB1 satisfies one of the first condition (the condition of the oscillator 131) or the second condition (the condition of the oscillator 132) in the first state ST1. In the first condition, the first magnetic moment MT1 is smaller than the second magnetic moment MT2; and the magnetic unit magnetic field Hex has the orientation of the second magnetization M2. In the second condition, the first magnetic moment MT1 is larger than the second magnetic moment MT2; and the magnetic unit magnetic field Hex has the orientation of the first magnetization M1.

FIG. 15A to FIG. 15K are schematic views illustrating another oscillator according to the third embodiment.

Figure 15A:
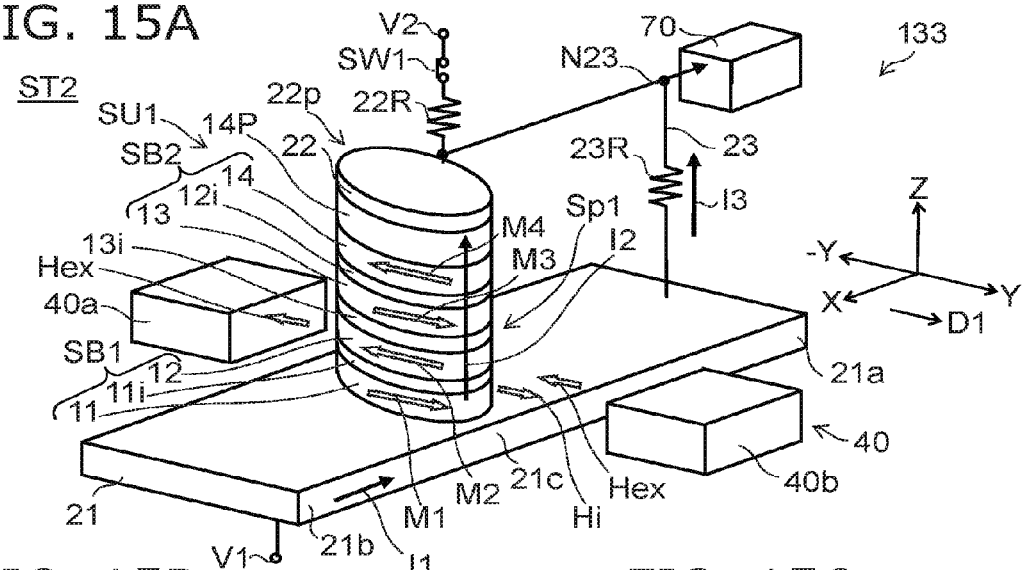
FIG. 15A to FIG. 15K are schematic views illustrating another oscillator according to the third embodiment.
Figure 15B:
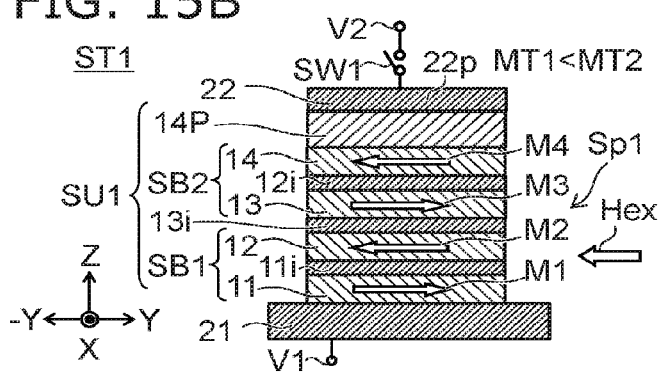
Figure 15C:
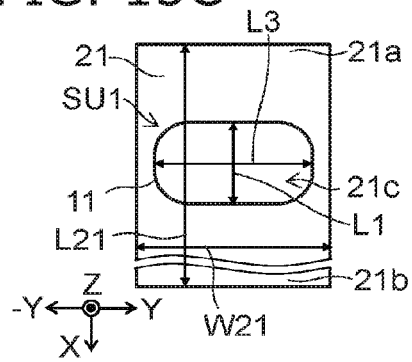

FIG. 15A is a perspective view. FIG. 15B is a cross-sectional view. FIG. 15C is a plan view. FIG. 15D to FIG. 15K are plan views illustrating the magnetizations.

As shown in FIG. 15A, the other oscillator 133 according to the embodiment also includes the first conductive body 21, the second conductive body 22, the third conductive body 23, the first stacked unit SU1, and the magnetic unit 40. In the oscillator 133, the first conductive body 21 includes a material having a negative spin Hall conductivity. For example, the first conductive body 21 includes at least one of Ta, W, or Re. Otherwise, the oscillator 133 is similar to the oscillator 131.

In the oscillator 133, the first magnetic moment MT1 of the first magnetic layer 11 is smaller than the second magnetic moment MT2 of the second magnetic layer 12. The magnetic unit magnetic field Hex in the space Sp1 generated from the magnetic unit 40 has the orientation of the second magnetization M2 (in the example, the −Y direction).

In the oscillator 133, the current magnetic field Hi that is generated in the space Sp1 between the third region 21c and the portion 22p when a current is caused to flow in the first conductive body 21 from the second region 21b toward the first region 21a has the first orientation D1 along the third direction. In the example, the first orientation D1 is the Y direction. In such a case, in the first state ST1, the first magnetization M1 and the third magnetization M3 have the first orientation D1.

Figure 15D:
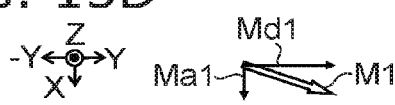
Figure 15E:
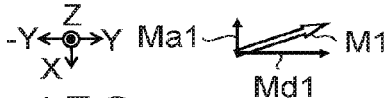
Figure 15F:
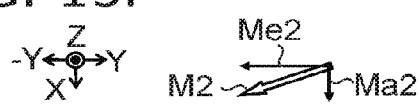
Figure 15G:
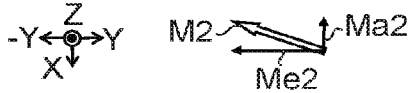
Figure 15H:
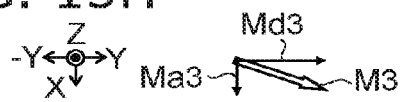
Figure 15I:
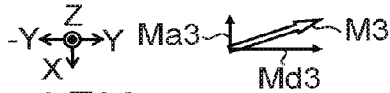
Figure 15J:
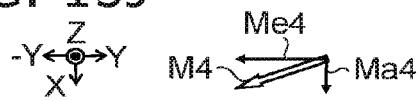
Figure 15K:
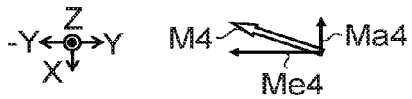

In other words, in the first state ST1 as shown in FIG. 15D and FIG. 15E, the component Md1 (the absolute value of the component Md1) in the first orientation D1 of the first magnetization M1 is larger than the first-direction component Ma1 (the absolute value of the component Ma1) of the first magnetization M1. In the first state ST1 as shown in FIG. 15H and FIG. 15I, the component Md3 (the absolute value of the component Md3) in the first orientation D1 of the third magnetization M3 is larger than the first-direction component Ma3 (the absolute value of the component Ma3) of the third magnetization M3. The second magnetization M2 is substantially antiparallel to the first magnetization M1. In the first state ST1 as shown in FIG. 15F and FIG. 15G, the component Me2 (the absolute value of the component Me2) in the reverse orientation of the first orientation D1 of the second magnetization M2 (the −Y direction) is larger than the first-direction component Ma2 (the absolute value of the component Ma2) of the second magnetization M2. The fourth magnetization M4 is substantially antiparallel to the third magnetization M3. In the first state ST1 as shown in FIG. 15J and FIG. 15K, the component Me4 (the absolute value of the component Me4) in the reverse orientation of the first orientation D1 of the fourth magnetization M4 is larger than the first-direction component Ma4 (the absolute value of the component Ma4) of the fourth magnetization M4.

In the oscillator 133 as well, for example, the two types of spin torque of the action of the spin Hall torque and the action of the spin-polarized current spin torque are utilized. Thereby, a stable oscillation is obtained.

As shown in FIG. 15C, in the oscillator 113 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 16A:
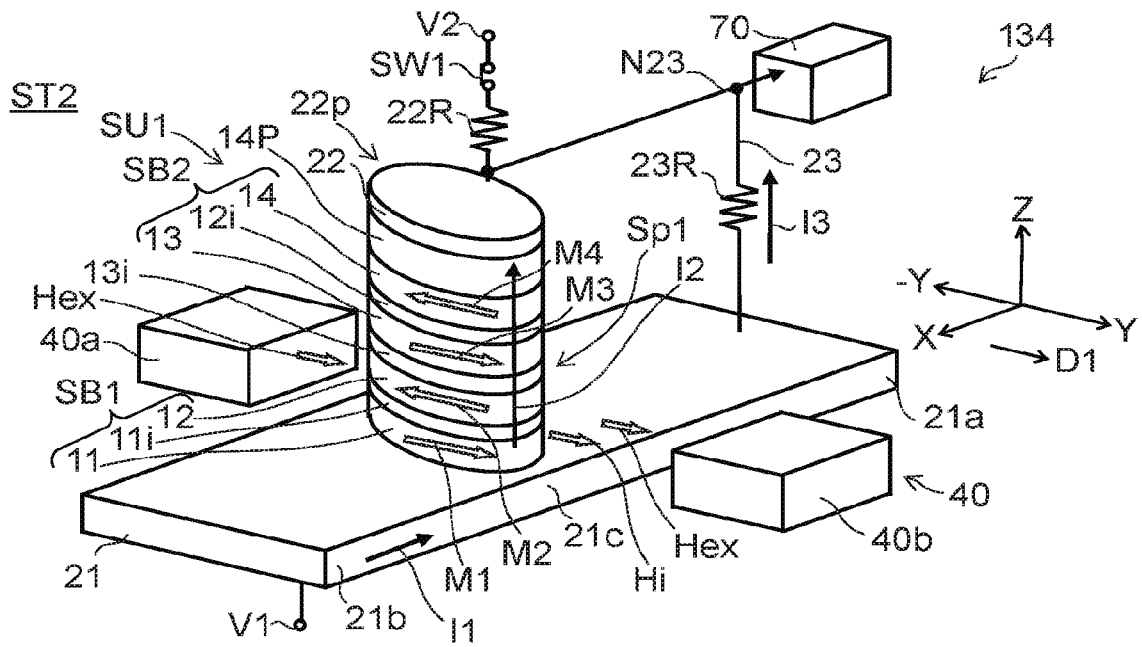
FIG. 16A and FIG. 16B are schematic views illustrating another oscillator according to the third embodiment.
Figure 16B:
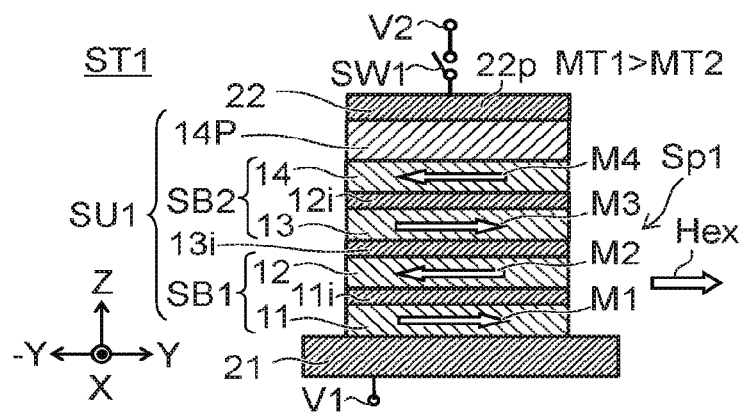

FIG. 16A and FIG. 16B are schematic views illustrating another oscillator according to the third embodiment.

FIG. 16A is a perspective view. FIG. 16B is a cross-sectional view.

As shown in FIG. 16A, the other oscillator 134 according to the embodiment also includes the first conductive body 21, the second conductive body 22, the third conductive body 23, the first stacked unit SU1, and the magnetic unit 40. In the oscillator 134, the first magnetic moment MT1 of the first magnetic layer 11 is larger than the second magnetic moment MT2 of the second magnetic layer 12. The magnetic unit magnetic field Hex in the space Sp1 generated from the magnetic unit 40 has the orientation of the first magnetization M1 (in the example, the Y direction). Otherwise, the oscillator 134 is similar to the oscillator 133.

In the oscillator 134 as well, the first conductive body 21 includes a material having a negative spin Hall conductivity (e.g., Ta, W, Re, etc.). The orientation (the first orientation D1) of the current magnetic field Hi generated in the space Sp1 when a current is caused to flow in the first conductive body 21 from the second region 21b toward the first region 21a is the Y direction.

In the first state ST1 as shown in FIG. 16B, the first magnetization M1 and the third magnetization M3 have the first orientation D1 (the Y direction). On the other hand, the second magnetization M2 and the third magnetization M3 have the reverse orientation of the first orientation D1 (the −Y direction). For example, as described in reference to FIG. 15D and FIG. 15E, in the first state ST1, the component Md1 (the absolute value of the component Md1) in the first orientation D1 (in the example, the Y direction) of the first magnetization M1 is larger than the component Ma1 (the absolute value of the component Ma1) in the first direction (in the example, the X direction) of the first magnetization M1. In the first state ST1, the component Md3 (the absolute value of the component Md3) in the first orientation D1 of the third magnetization M3 is larger than the first-direction component Ma3 (the absolute value of the component Ma3) of the third magnetization M3.

In the oscillator 134 as well, for example, the two types of spin torque of the action of the spin Hall torque and the action of the spin-polarized current spin torque are utilized. Thereby, a stable oscillation is obtained.

In the oscillators 133 and 134 recited above, as described above, the first conductive body 21 includes a material having a negative spin Hall conductivity (e.g., Ta, W, Re, etc.). In such a case, the first stacked body SB1 satisfies one of the first condition (the condition of the oscillator 133) or the second condition (the condition of the oscillator 134) in the first state ST1. In the first condition, the first magnetic moment MT1 is smaller than the second magnetic moment MT2; and the magnetic unit magnetic field Hex has the orientation of the second magnetization M2. In the second condition, the first magnetic moment MT1 is larger than the second magnetic moment MT2; and the magnetic unit magnetic field Hex has the orientation of the first magnetization M1.

In the oscillators 131 to 134, the angle θ between the second magnetization M2 and the third magnetization M3 (referring to FIG. 3) may be not less than 170 degrees and not more than 190 degrees. For example, the parametric resonance occurs. The oscillation stabilizes further.

Fourth Embodiment

FIG. 17A to FIG. 17K are schematic views illustrating an oscillator according to a fourth embodiment.

Figure 17A:
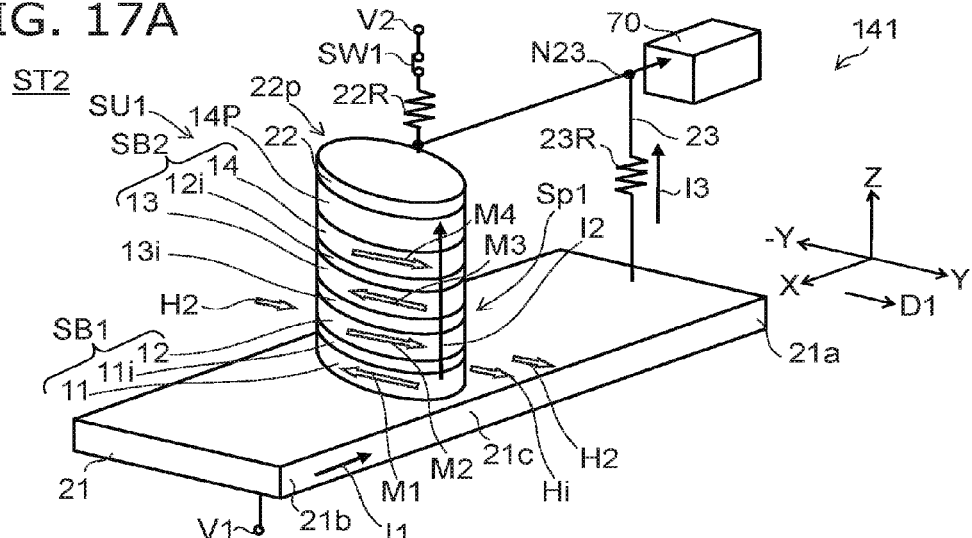
FIG. 17A to FIG. 17K are schematic views illustrating an oscillator according to a fourth embodiment.
Figure 17B:
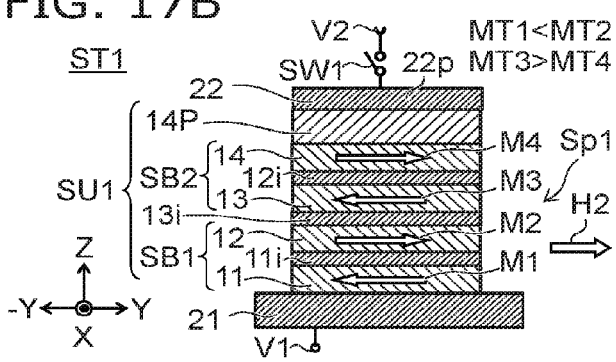
Figure 17C:
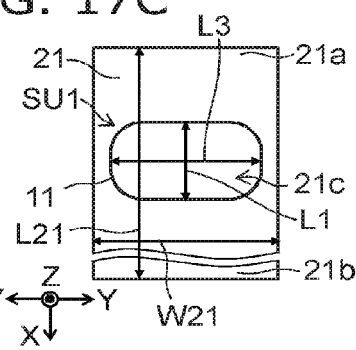

FIG. 17A is a perspective view. FIG. 17B is a cross-sectional view. FIG. 17C is a plan view. FIG. 17D to FIG. 17K are plan views illustrating the magnetizations.

As shown in FIG. 17A, the oscillator 141 according to the embodiment includes the first conductive body 21, the second conductive body 22, the third conductive body 23, and the first stacked unit SU1. The magnetic unit 40 is omitted from the oscillator 141. In the oscillator 141, for example, the magnetic field H2 that is generated from the second stacked body SB2 acts on the first stacked body SB1. In the oscillator 141, in the first state ST1, the first magnetic moment MT1 of the first magnetic layer 11 is smaller than the second magnetic moment MT2 of the second magnetic layer 12. The third magnetic moment MT3 of the third magnetic layer 13 is larger than the fourth magnetic moment MT4 of the fourth magnetic layer 14. Otherwise, the oscillator 141 is similar to the oscillator 131.

In the example as well, in the first state ST1 as shown in FIG. 17B, the first to fourth magnetizations M1 to M4 are aligned with the third direction perpendicular to the first direction (the X direction) and the second direction (the Z direction). The third direction is, for example, the −Y direction or the Y direction.

In the example as well, the second magnetization M2 has a component in the reverse orientation of the first magnetization M1; and the fourth magnetization M4 has a component in the reverse orientation of the third magnetization M3. For example, the second magnetization M2 is antiparallel to the first magnetization M1. For example, the fourth magnetization M4 is antiparallel to the third magnetization M3.

The current magnetic field Hi that is generated in the space Sp1 between the third region 21c and the portion 22p when a current is caused to flow in the first conductive body 21 from the second region 21b toward the first region 21a has the first orientation D1 along the third direction. The first orientation D1 is, for example, the Y direction.

Figure 17D:
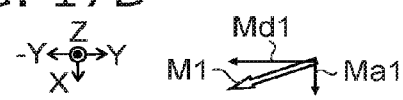
Figure 17E:
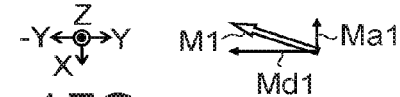
Figure 17F:
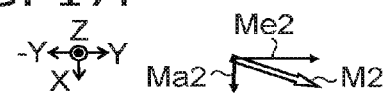
Figure 17G:
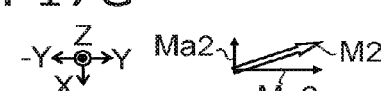
Figure 17H:
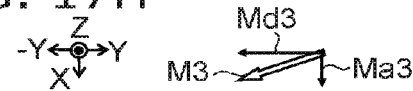
Figure 17I:
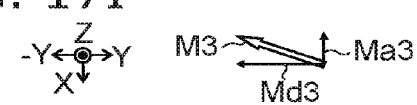
Figure 17J:
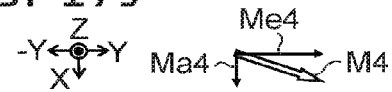
Figure 17K:
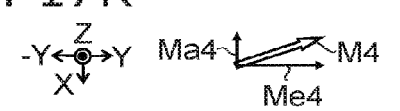

In the first state ST1 as shown in FIG. 17F and FIG. 17G, the component Md2 (the absolute value of the component Md2) in the first orientation D1 of the second magnetization M2 is larger than the first-direction component Ma2 (the absolute value of the component Ma2) of the second magnetization M2. In the first state ST1 as shown in FIG. 173 and FIG. 17K, the component Md4 (the absolute value of the component Md4) in the first orientation D1 of the fourth magnetization M4 is larger than the first-direction component Ma4 (the absolute value of the component Ma4) of the fourth magnetization M4. On the other hand, in the first state ST1 as shown in FIG. 17D and FIG. 17E, the component Me1 (the absolute value of the component Me1) in the reverse orientation of the first orientation D1 (the −Y direction) of the first magnetization M1 is larger than the first-direction component Ma1 (the absolute value of the component Ma1) of the first magnetization M1. In the first state ST1 as shown in FIG. 17H and FIG. 17I, the component Me3 (the absolute value of the component Me3) in the reverse orientation of the first orientation D1 of the third magnetization M3 is larger than the first-direction component Ma3 (the absolute value of the component Ma3) of the third magnetization M3.

The first conductive body 21 includes at least one of Ru, Rh, Pd, Os, or Pt. The first conductive body 21 includes a material having a positive spin Hall conductivity.

In the oscillator 141, the magnetic field H2 that is generated from the second stacked body SB2 acts on the first stacked body SB1. The orientation of the magnetic field H2 is the same as the orientation of the magnetic unit magnetic field Hex in the oscillator 131. For example, the magnetic field H2 has the orientation of the second magnetization M2.

In the oscillator 141 as well, for example, the two types of spin torque of the action of the spin Hall torque and the action of the spin-polarized current spin torque are utilized. Thereby, a stable oscillation is obtained.

As shown in FIG. 17C, in the oscillator 141 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 18A:
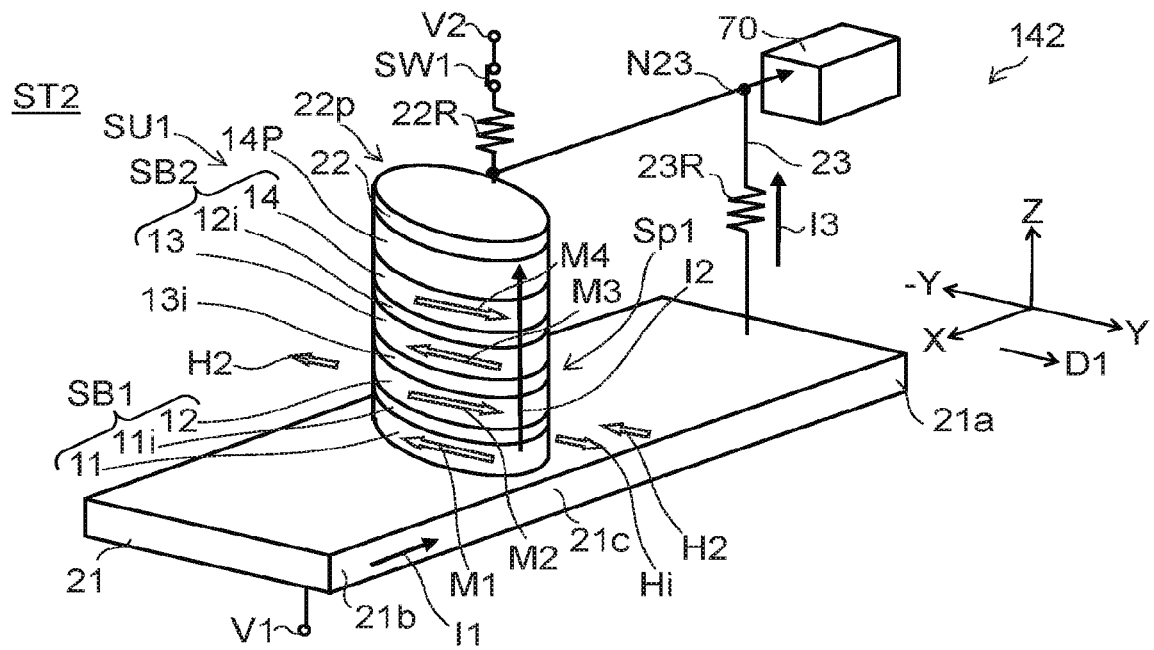
FIG. 18A and FIG. 18B are schematic views illustrating another oscillator according to the fourth embodiment.
Figure 18B:
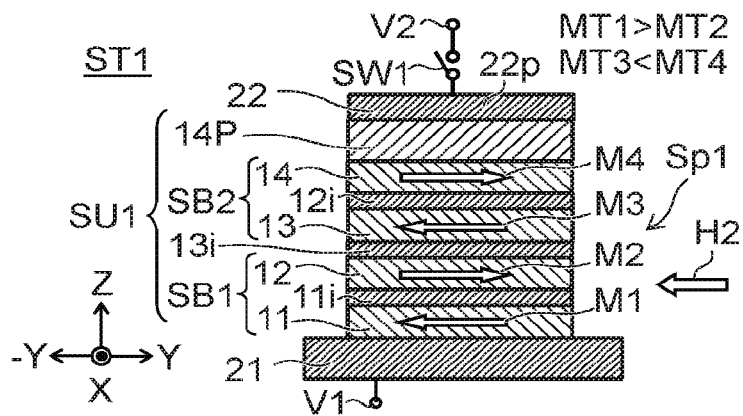

FIG. 18A and FIG. 18B are schematic views illustrating another oscillator according to the fourth embodiment.

FIG. 18A is a perspective view. FIG. 18B is a cross-sectional view.

As shown in FIG. 18A, the oscillator 142 according to the embodiment also includes the first conductive body 21, the second conductive body 22, the third conductive body 23, and the first stacked unit SU1. The magnetic unit 40 is omitted from the oscillator 142 as well. In the oscillator 142, the first magnetic moment MT1 of the first magnetic layer 11 is larger than the second magnetic moment MT2 of the second magnetic layer 12. The third magnetic moment MT3 of the third magnetic layer 13 is smaller than the fourth magnetic moment MT4 of the fourth magnetic layer 14. Otherwise, the oscillator 142 is similar to the oscillator 141.

In the oscillator 142 as well, in the first state ST1 as shown in FIG. 10B, the first to fourth magnetizations M1 to M4 are aligned with the third direction. The third direction is perpendicular to the first direction (the X direction) and the second direction (the Z direction). The third direction is the −Y direction or the Y direction. In the first state ST1, the second magnetization M2 and the fourth magnetization M4 have the first orientation D1 (the Y direction). The magnetic field H2 that is generated from the second stacked body SB2 and applied to the first stacked body SB1 has the orientation of the first magnetization M1.

In the oscillator 142 as well, for example, the two types of spin torque of the action of the spin Hall torque and the action of the spin-polarized current spin torque are utilized. Thereby, a stable oscillation is obtained.

In the oscillators 141 and 142, the first conductive body 21 includes, for example, a material having a positive spin Hall conductivity. In the first state ST1, the component Md2 (the absolute value of the component Md2) in the first orientation D1 of the second magnetization M2 is larger than the first-direction component Ma1 (the absolute value of the component Ma1) of the second magnetization M2; and the component Md4 (the absolute value of the component Md4) in the first orientation D1 of the fourth magnetization M4 is larger than the first-direction component Ma4 (the absolute value of the component Ma4) of the fourth magnetization M4. In such a case, the first stacked body SB1 satisfies one of the first condition (the condition of the oscillator 141) or the second condition (the condition of the oscillator 142) in the first state ST1. In the first condition, the first magnetic moment MT1 is smaller than the second magnetic moment MT2; and the third magnetic moment MT3 is larger than the fourth magnetic moment MT4. In the second condition, the first magnetic moment MT1 is larger than the second magnetic moment MT2; and the third magnetic moment MT3 is smaller than the fourth magnetic moment MT4.

FIG. 19A to FIG. 19K are schematic views illustrating another oscillator according to the fourth embodiment.

FIG. 19A is a perspective view. FIG. 19B is a cross-sectional view. FIG. 19C is a plan view. FIG. 19D to FIG. 19K are plan views illustrating the magnetizations.

As shown in FIG. 19A, the oscillator 143 according to the embodiment also includes the first conductive body 21, the second conductive body 22, the third conductive body 23, and the first stacked unit SU1. In the example as well, the magnetic field H2 that is generated from the second stacked body SB2 is applied to the first stacked body SB1. In the oscillator 143, the first conductive body 21 includes a material having a negative spin Hall conductivity (e.g., Ta, W, Re, etc.). Otherwise, the oscillator 143 is similar to the oscillator 141.

As shown in FIG. 19B, in the oscillator 143 as well, in the first state ST1, the first to fourth magnetizations M1 to M4 are aligned with the third direction (the −Y direction or the Y direction) perpendicular to the first direction (the X direction) and the second direction (the Z direction). The second magnetization M2 has a component in the reverse orientation of the first magnetization M1. The fourth magnetization M4 has a component in the reverse orientation of the third magnetization M3.

As shown in FIG. 19A, the current magnetic field Hi that is generated in the space Sp1 between the third region 21c and the portion 22p when a current is caused to flow in the first conductive body 21 from the second region 21b toward the first region 21a has the first orientation D1 along the third direction. In the example, the first orientation D1 is the Y direction.

In the first state ST1, the first magnetization M1 and the third magnetization M3 have the first orientation D1 (the Y direction). In the first state ST1 as shown in FIG. 19D and FIG. 19E, the component Md1 (the absolute value of the component Md1) in the first orientation D1 of the first magnetization M1 is larger than the first-direction component Ma1 (the absolute value of the component Ma1) of the first magnetization M1. In the first state ST1 as shown in FIG. 11H and FIG. 11I, the component Md3 (the absolute value of the component Md3) in the first orientation D1 of the third magnetization M3 is larger than the first-direction component Ma3 (the absolute value of the component Ma3) of the third magnetization M3. On the other hand, in the first state ST1 as shown in FIG. 19F and FIG. 19G, the component Me2 (the absolute value of the component Me2) in the reverse orientation of the first orientation D1 of the second magnetization M2 is larger than the first-direction component Ma2 (the absolute value of the component Ma2) of the second magnetization M2. In the first state ST1 as shown in FIG. 19J and FIG. 19K, the component Me4 (the absolute value of the component Me4) in the reverse orientation of the first orientation D1 of the fourth magnetization M4 is larger than the first-direction component Ma4 (the absolute value of the component Ma4) of the fourth magnetization M4.

In the oscillator 143, in the first state ST1, the first magnetic moment MT1 of the first magnetic layer 11 is smaller than the second magnetic moment MT2 of the second magnetic layer 12. The third magnetic moment MT3 of the third magnetic layer 13 is larger than the fourth magnetic moment MT4 of the fourth magnetic layer 14.

The magnetic field H2 that is generated from the second stacked body SB2 and applied to the first stacked body SB1 has the orientation of the second magnetization M2.

In the oscillator 143 as well, for example, the two types of spin torque of the action of the spin Hall torque and the action of the spin-polarized current spin torque are utilized. Thereby, a stable oscillation is obtained.

As shown in FIG. 19C, in the oscillator 123 as well, the length L3 along the third direction (the Y direction or the −Y direction) of the first magnetic layer 11 is not less than the length L1 along the first direction (the X direction) of the first magnetic layer 11. The length L3 may be longer than the length L1.

Figure 20A:
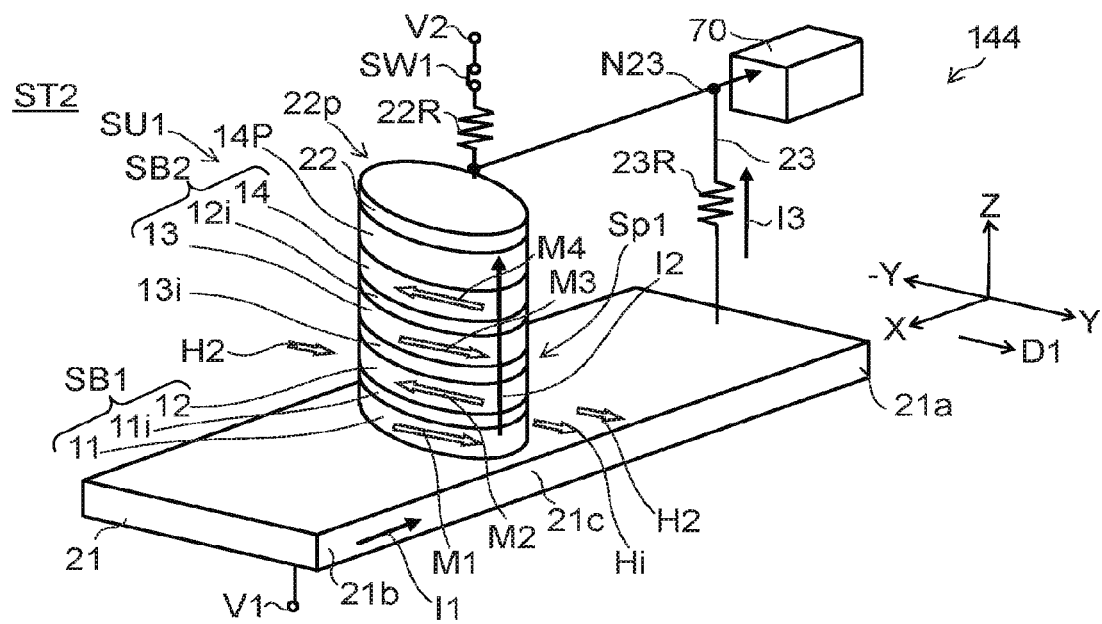
FIG. 20A and FIG. 20B are schematic views illustrating another oscillator according to the fourth embodiment.
Figure 20B:
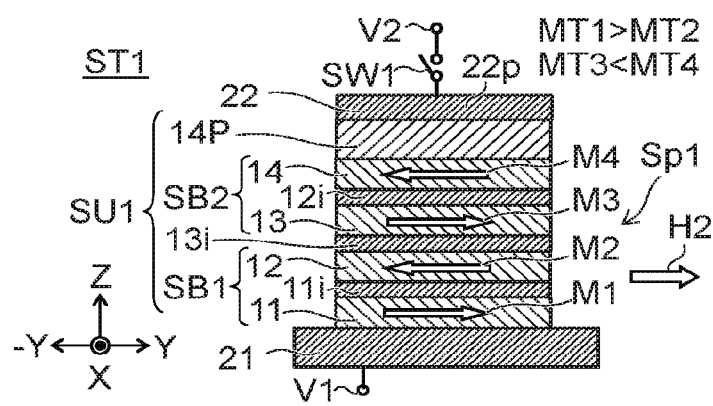

FIG. 20A and FIG. 20B are schematic views illustrating another oscillator according to the fourth embodiment.

FIG. 20A is a perspective view. FIG. 20B is a cross-sectional view.

As shown in FIG. 20A, the oscillator 144 according to the embodiment also includes the first conductive body 21, the second conductive body 22, the third conductive body 23, and the first stacked unit SU1. The magnetic unit 40 is omitted from the oscillator 144 as well. In the oscillator 144, the first magnetic moment MT1 of the first magnetic layer 11 is smaller than the second magnetic moment MT2 of the second magnetic layer 12. The third magnetic moment MT3 of the third magnetic layer 13 is smaller than the fourth magnetic moment MT4 of the fourth magnetic layer 14. Otherwise, the oscillator 144 is similar to the oscillator 143.

The magnetic field H2 that is generated from the second stacked body SB2 and applied to the first stacked body SB1 has the orientation of the first magnetization M1.

In the oscillator 144 as well, for example, the two types of spin torque of the action of the spin Hall torque and the action of the spin-polarized current spin torque are utilized. Thereby, a stable oscillation is obtained.

In the oscillators 143 and 144, the first conductive body 21 includes, for example, a material having a negative spin Hall conductivity. The component Md1 (the absolute value of the component Md1) in the first orientation D1 of the first magnetization M1 is larger than the component Ma1 (the absolute value of the component Ma1) in the first direction (the X direction) of the first magnetization M1. The component Md3 (the absolute value of the component Md3) in the first orientation D1 of the third magnetization M3 is larger than the first-direction component Ma3 of the third magnetization M3. In such a case, the first stacked body SB1 satisfies one of the first condition (the condition of the oscillator 143) or the second condition (the condition of the oscillator 144). In the first condition, the first magnetic moment MT1 is smaller than the second magnetic moment MT2; and the third magnetic moment MT3 is larger than the fourth magnetic moment MT4. In the second condition, the first magnetic moment MT1 is larger than the second magnetic moment MT2; and the third magnetic moment MT3 is smaller than the fourth magnetic moment MT4.

In the oscillators 141 to 144, the angle θ between the second magnetization M2 and the third magnetization M3 (referring to FIG. 3) may be not less than 170 degrees and not more than 190 degrees. For example, the parametric resonance occurs. The oscillation stabilizes further.

Fifth Embodiment

Figure 21A:
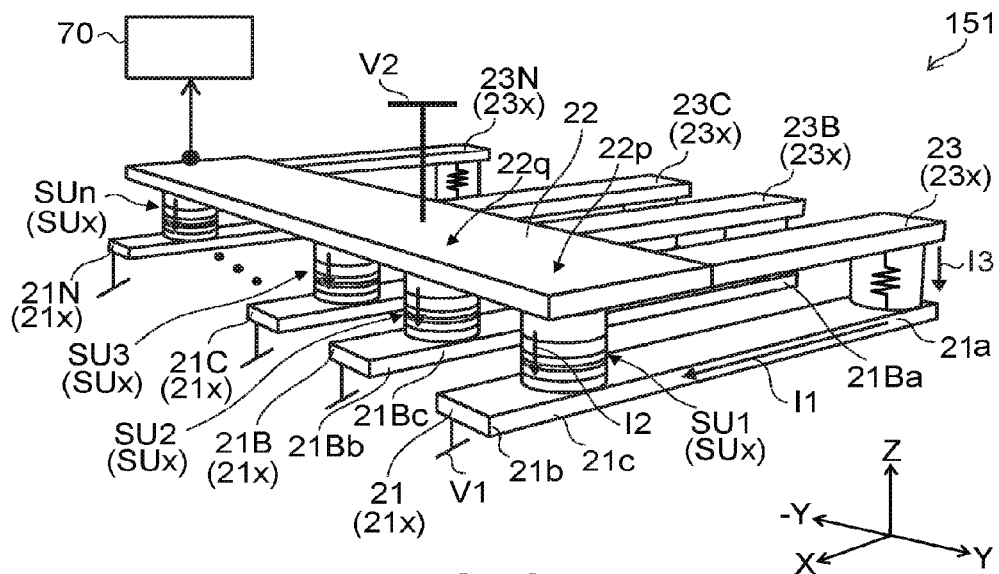
FIG. 21A and FIG. 21B are schematic views illustrating an oscillator according to a fifth embodiment.
Figure 21B:
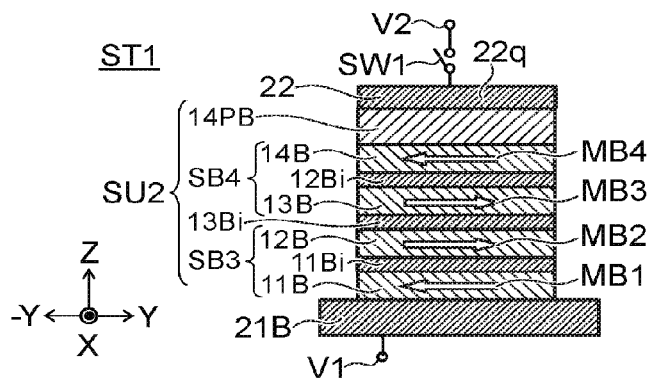

FIG. 21A and FIG. 21B are schematic views illustrating an oscillator according to a fifth embodiment.

FIG. 21A is a perspective view. FIG. 21B is a cross-sectional view.

As shown in FIG. 21A, multiple first conductive bodies 21x, the second conductive body 22, multiple third conductive bodies 23x, and multiple stacked units SUx are provided in the oscillator 151 according to the embodiment. The multiple first conductive bodies 21x are arranged in the third direction (the −Y direction or the Y direction). The multiple stacked units SUx are provided respectively between the second conductive body 22 and the third region (the third region 21c or the like) of each of the multiple first conductive bodies 21x. The second conductive body 22 and the first region (the first region 21a or the like) of the multiple first conductive bodies 21x are electrically connected by the multiple third conductive bodies 23x. For example, the second conductive body 22 extends along the third direction.

One of the multiple first conductive bodies 21x corresponds to the first conductive body 21. One of the multiple third conductive bodies 23x corresponds to the third conductive body 23. One of the multiple stacked units SUx corresponds to the first stacked unit SU1.

The configuration described in reference to the first conductive body 21 is applicable to each of the multiple first conductive bodies 21x (conductive bodies 21B, 21C, 21N, etc.). The configuration described in reference to the third conductive body 23 is applicable to each of the multiple third conductive bodies 23x (conductive bodies 23B, 23C, 23N, etc.). The configuration described in reference to the first stacked unit SU1 is applicable to each of the multiple stacked units SUx (stacked units SU2, SU3, SUn, etc.).

For example, the oscillator 151 further includes the fourth conductive body 21B, the second stacked unit SU2, and the fifth conductive body 23B in addition to the first conductive body 21, the second conductive body 22, the third conductive body 23, and the first stacked unit SU1.

The fourth conductive body 21B is arranged with the first conductive body 21 in the third direction (e.g., the −Y direction or the Y direction). The fourth conductive body 21B includes a fourth region 21Ba, a fifth region 21Bb, and a sixth region 21Bc. The fifth region 21Bb is arranged with the fourth region 21Ba in the first direction (the X direction). The sixth region 21Bc is provided between the fourth region 21Ba and the fifth region 21Bb.

The second stacked unit SU2 is provided between the sixth region 21Bc and another portion 22q of the second conductive body 22.

As shown in FIG. 21B, the second stacked unit SU2 includes the fifth to eighth magnetic layers 11B to 14B and fourth to sixth intermediate layers 11Bi to 13Bi. In the example, the second stacked unit SU2 further includes a second conductive body-side magnetic layer 14PB. The fifth to eighth magnetic layers 11B to 14B respectively include fifth to eighth magnetizations MB1 to MB4.

The sixth magnetic layer 12B is provided between the fifth magnetic layer 11B and the other portion 22q recited above. The fourth intermediate layer 11Bi is provided between the fifth magnetic layer 11B and the sixth magnetic layer 12B.

The seventh magnetic layer 13B is provided between the sixth magnetic layer 12B and the other portion 22q recited above. The eighth magnetic layer 14B is provided between the seventh magnetic layer 13B and the other portion 22q recited above. The fifth intermediate layer 12Bi is provided between the seventh magnetic layer 13B and the eighth magnetic layer 14B.

The sixth intermediate layer 13Bi is provided between the sixth magnetic layer 12B and the seventh magnetic layer 13B.

The fifth conductive body 23B is electrically connected to the second conductive body 22 and the fourth region 21Ba.

In the first state ST1, the fifth to eighth magnetizations MB1 to MB4 are aligned with the third direction (e.g., the −Y direction or the Y direction).

The sixth magnetization MB2 has a component in the reverse orientation of the fifth magnetization MB1. The eighth magnetization MB4 has a component in the reverse orientation of the seventh magnetization MB3. For example, the sixth magnetization MB2 is antiparallel to the fifth magnetization MB1. For example, the eighth magnetization MB4 is antiparallel to the seventh magnetization MB3.

The fifth magnetic layer 11B, the fourth intermediate layer 11Bi, and the sixth magnetic layer 12B are included in a third stacked body SB3. The seventh magnetic layer 13B, the fifth intermediate layer 12Bi, and the eighth magnetic layer 14B are included in a fourth stacked body SB4.

The configurations of the first to fourth magnetic layers 11 to 14 are applicable respectively to the fifth to eighth magnetic layers 11B to 14B. The configurations of the first to third intermediate layers 11i to 13i are applicable respectively to the fourth to sixth intermediate layers 11Bi to 13Bi.

In the second state, a current is caused to flow in the fourth conductive body 21B; a current is caused to flow in the second stacked unit SU2; and a current is caused to flow in the fifth conductive body 23B.

For example, the spin Hall torque acts on the fifth magnetization MB1 of the fifth magnetic layer 11B; and, for example, the spin-polarized current spin torque acts on the sixth magnetization MB2 of the sixth magnetic layer 12B. The two magnetic layers (the fifth magnetic layer 11B and the sixth magnetic layer 12B) are excited simultaneously based on the two types of spin torque. Thereby, a large magnetization oscillation energy is generated. Thereby, a stable oscillation is obtained.

In the oscillator 151, the multiple stacked units SUx are connected to each other via the second conductive body 22. The multiple stacked units SUx perform electrical interactions with each other via the second conductive body 22. The magnetizations of the stacked bodies (the first stacked body SB1, the third stacked body SB3, etc.) included in the multiple stacked units SUx oscillate synchronously with each other. For example, a stable oscillation output is obtained from the circuit unit 70.

In the oscillator 151, any configuration described in reference to the first to fourth embodiments and the configuration of a modification of the first to fourth embodiments are applicable to the stacked bodies (the magnetic layers, the intermediate layers, etc.). The magnetic unit 40 may be provided as necessary and may be omitted.

An example of simulation results for the characteristics of the oscillator according to the embodiment will now be described.

Figure 22:
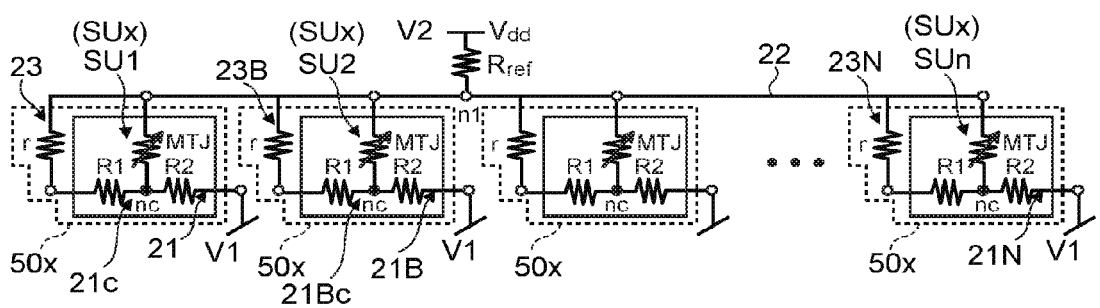
FIG. 22 is a schematic view illustrating the simulation model of the oscillator according to the embodiment.

FIG. 22 is a schematic view illustrating the simulation model of the oscillator according to the embodiment. As shown in FIG. 22, the multiple stacked units SUx (the first stacked unit SU1, the second stacked unit SU2, the Nth stacked unit SUn, etc.) are connected in parallel with each other via the second conductive body 22. The simulation is performed even for the case where the number of the stacked units SUx is 1.

In this model, the first conductive body 21 (and the conductive body 21B, the conductive body 21N, etc.) are tungsten. An electrical resistivity ρ of the first conductive body 21 (and the conductive body 21B, the conductive body 21N, etc.) is 200 µΩ·cm. The length (the length L21) in the first direction (the X direction) of the first conductive body 21 (and the conductive body 21B, the conductive body 21N, etc.) is 1.4 µm. The length (the width W21) of the third direction (the −Y direction or the Y direction) of the first conductive body 21 (and the conductive body 21B, the conductive body 21N, etc.) is 100 nm. The thickness (the length in the Z direction) is 6 nm. The spin Hall angle is −0.35 (a dimensionless quantity). A node nc corresponds to the third region 21c of the first conductive body 21. The distance between the node nc and the end of the first region 21a (the distance between the node nc and the third conductive body 23) is 1.25 µm. The distance between the node nc and the end of the second region 21b (the distance between the node nc and the conductor of the first potential V1) is 0.15 µm. A resistor R1 between the node nc and the end of the first region 21a is 0.5 kΩ. The resistance between the node nc and the end of the second region 21b is 4.166 kΩ.

A metal that has high conductivity (e.g., Cu, etc.) is used as the second conductive body 22. As described below, in the simulation, a resistor Rref of the second conductive body 22 is modified.

The third conductive body 23 (and the conductive body 23B, the conductive body 23N, etc.) include a metal that has high conductivity (e.g., Cu, etc.). The resistor r of the third conductive body 23 (and the conductive body 23B, the conductive body 23N, etc.) is 50Ω.

Each of the multiple stacked units SUx has a circular columnar configuration. The diameter of the circular column is 100 nm. The third intermediate layer 13i (and the sixth intermediate layer 13Bi, etc.) include MgO. Each of the multiple stacked units SUx has a magnetic tunnel junction (MTJ).

The resistance per area of each of the multiple stacked units SUx is 7.85 $\Omega \cdot \mu m^2$. The tunneling magnetoresistance ratio is 200%. The spin polarization ratio is 0.7.

The thickness of the first magnetic layer 11 is 2 nm. The thickness of the first intermediate layer 11i is 1 nm. The thickness of the second magnetic layer 12 is 2 nm. The thickness of the third intermediate layer 13i is 1 nm. The thickness of the third magnetic layer 13 is 2 nm. The thickness of the second intermediate layer 12i is 0.5 nm. The thickness of the fourth magnetic layer 14 is 7 nm.

The antiferromagnetic exchange coupling coefficient of the first stacked body SB1 is −0.2 erg/cm². The antiferromagnetic exchange coupling coefficient of the second stacked body SB2 is −1 erg/cm².

A saturation magnetization Ms of the first magnetic layer 11 is 0.8 emu/cm³. The saturation magnetization Ms of the second magnetic layer 12 is 0.85 emu/cm³. The saturation magnetization Ms of the third magnetic layer 13 is 0.9 emu/cm³. The saturation magnetization Ms of the fourth magnetic layer 14 is 1.4 emu/cm³.

The surface areas of these magnetic layers each are S (S=π×50² nm²). The first magnetic moment MT1 of the first magnetic layer 11 is S×2×0.8 emu. The second magnetic moment MT2 of the second magnetic layer 12 is S×2×0.85 emu. The third magnetic moment MT3 of the third magnetic layer 13 is S×2×0.9 emu. The fourth magnetic moment MT4 of the fourth magnetic layer 14 is S×7×1.4 emu. Thus, in this model, the second magnetic moment MT2 is larger than the first magnetic moment MT1. The fourth magnetic moment MT4 is larger than the third magnetic moment MT3.

In the configuration of this model, the magnetic field H2 (the leakage magnetic field) from the second stacked body SB2 is applied to the first stacked body SB1. The magnetic field H2 is about 500 oersteds (Oe). The magnetic field H2 at the position of the first stacked body SB1 is aligned with the third direction (the −Y direction or the Y direction). The magnetic unit 40 is omitted from this model.

The fourth magnetization M4 of the fourth magnetic layer 14 is fixed in the third direction by the second conductive body-side magnetic layer 14P. The third magnetization M3 of the third magnetic layer 13 also is fixed in the third direction. The fixing is based on the antiferromagnetic coupling (a coupling coefficient of −1 erg/cm²) due to the second intermediate layer 12i. The third magnetization M3 has the reverse orientation of the fourth magnetization M4. In this model, the fourth magnetization M4 is in the −Y direction; and the third magnetization M3 is in the Y direction. The magnetizations of the second stacked body SB2 are in the −Y direction.

In the first state ST1, the first magnetization M1 of the first magnetic layer 11 is in the −Y direction. The second magnetization M2 of the second magnetic layer 12 is in the Y direction. The magnetic field H2 (500 oersteds) from the second stacked body SB2 is applied to the first stacked body SB1. The magnetic field H2 at the position of the first stacked body SB1 is in the Y direction.

The first potential V1 is 0 volts (V); and the second potential V2 (the voltage of the constant voltage source Vdd) is 2.1 V. One element unit 50x includes one stacked unit SUx, one first conductive body 21, and one third conductive body 23.

In the simulation, the number N of the multiple element units 50x is modified to be 1, 2, 4, 8, 16, and 24. The resistor Rref of the second conductive body 22 is modified to be 1900Ω, 950Ω, 505Ω, 275Ω, 162.5Ω, and 125Ω in conjunction with the number N of the six conditions. The voltage of a node n1 is about 1 V when the first potential V1 is used as the reference.

According to the simulation results, an oscillation output is obtained for all of the six conditions recited above. For each of the conditions, the two types of spin torque of the spin-polarized current spin torque and the spin Hall torque act on the magnetizations of the first stacked body SB1 with the self-feedback effect.

An example of the simulation results when the number N is 24 will now be described.

Figure 23A:
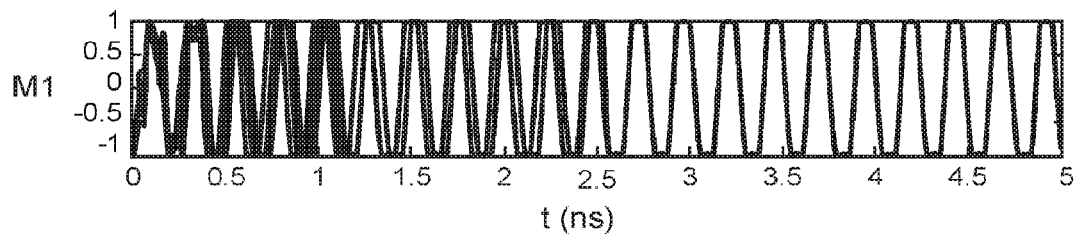
FIG. 23A to FIG. 23C are schematic views illustrating the simulation results of the oscillator according to the embodiment.
Figure 23B:
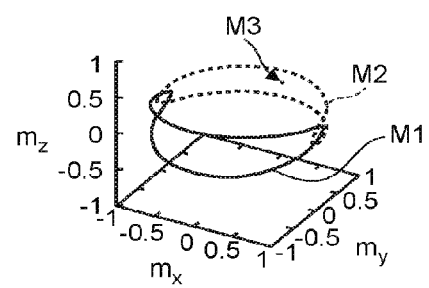
Figure 23C:
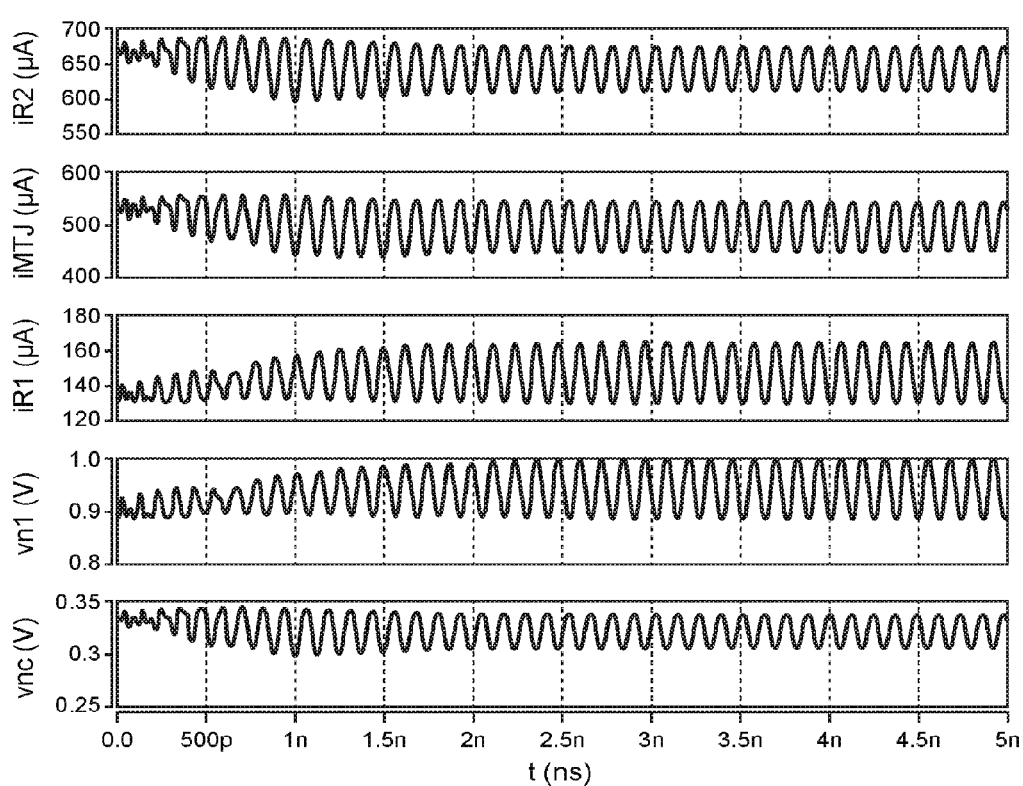

FIG. 23A to FIG. 23C are schematic views illustrating the simulation results of the oscillator according to the embodiment.

FIG. 23A shows the change of the first magnetizations M1 of the first magnetic layers 11 when the number N of the element unit 50x is 24 for the model shown in FIG. 22. The horizontal axis is the time t; and the vertical axis is the first magnetization M1. FIG. 23B shows the magnetization path of the first stacked body SB1 included in one element unit 50x. FIG. 23C shows the current and the voltage of one element unit 50x. The current iR1 is the current flowing through the resistor R1 (referring to FIG. 22). The current iMTJ is the current flowing through the stacked unit SUx (the MTJ referring to FIG. 22). The current iR2 is the current flowing in a resistor R2 (referring to FIG. 22). A voltage vn1 is the voltage of the node n1 (referring to FIG. 22). The voltage vnc is the voltage of the node nc (referring to FIG. 22). The units of the current are microamperes. The units of the voltage are volts.

In the initial state of the simulation (the time t being 0), the directions of the twenty-four first magnetizations M1 fluctuate with the −Y direction at the center.

As shown in FIG. 23A, the multiple first magnetizations M1 fluctuate in the interval when the time t is 0 ns to 2.5 ns. When the time t is 2.5 ns or more, the multiple first magnetizations M1 change synchronously. This is because the magnetizations of the twenty-four first stacked bodies SB1 interact via the second conductive body 22. The oscillation frequency is about 4 GHz.

In FIG. 23B, an axis mx, an axis my, and an axis mz respectively are the X-direction component of the magnetization, the Y-direction component of the magnetization, and the Z-direction component of the magnetization. The third magnetization M3 is substantially fixed. On the other hand, the first magnetization M1 and the second magnetization M2 change with time.

As shown in FIG. 23B, the change of the level of the resistance of the stacked unit SUx occurs two times during the change of one period of the second magnetization M2.

The frequency of the current and the voltage shown in FIG. 23A is about 8 GHz and is about 2 times the frequency of the magnetization oscillation (about 4 GHz).

The two spin torques (the spin-polarized current spin torque and the spin Hall torque) that accompany the alternating current components of the magnetizations of the first stacked body SB1 are fed back to the magnetizations of the first stacked body SB1. The feedback is performed via the current iMTJ, the current iR1, and the current iR1.

For example, self-feedback that is similar to parametric resonance occurs; and the oscillation is stabilized. Thus, in the embodiment, the two types of spin torque of the spin-polarized current spin torque and the spin Hall torque act on the magnetizations of the first stacked body SB1 with the self-feedback effect. At the node n1, a voltage output that corresponds to a stable oscillation is obtained.

The examples of FIG. 23A to FIG. 23C are simulation results in the case where there is no heat fluctuation of the magnetization. A stable oscillation output is obtained also for a simulation including heat fluctuation of the magnetization (e.g., assuming room temperature operations). The oscillation is more stable when the number N of the element units 50*x* is large.

Sixth Embodiment

The embodiment relates to a calculating device.

Figure 24:
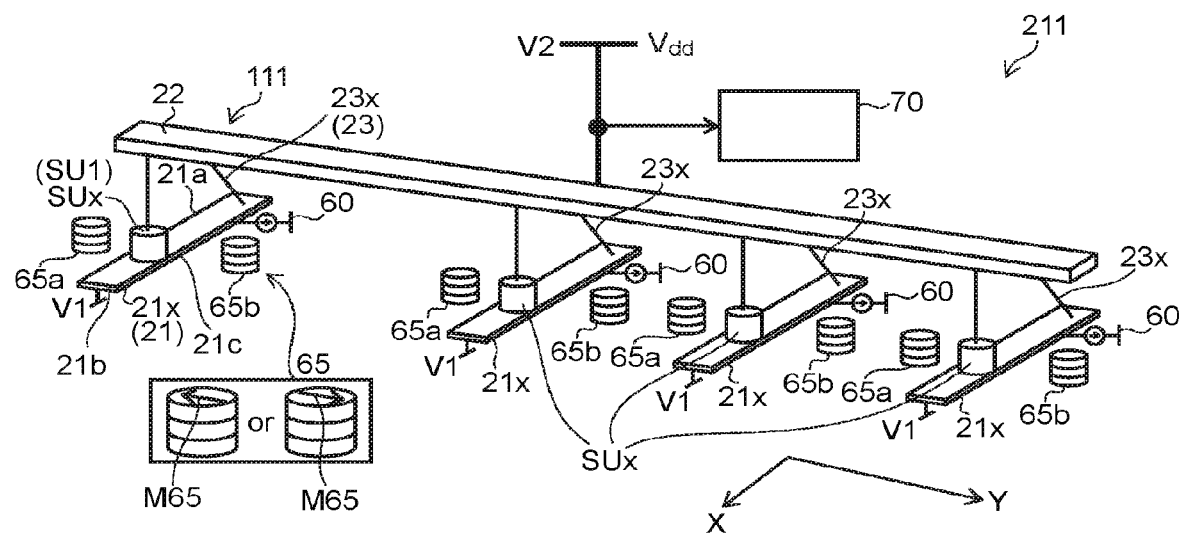
FIG. 24 is a schematic view illustrating the calculating device according to the sixth embodiment.

FIG. 24 is a schematic view illustrating the calculating device according to the sixth embodiment.

As shown in FIG. 24, the calculating device 211 according to the embodiment includes the oscillator according to the first to fifth embodiments (and modifications of the oscillators) and a magnetic element unit 65. The oscillator 111 is illustrated in the example. The oscillators 121 to 124, 141 to 144, etc., may be used. In the third direction (the −Y direction or the Y direction), at least a portion of the magnetic element unit 65 and at least a portion of the first stacked unit SU1 (at least one of the multiple stacked units SUx) overlap each other. A magnetization M65 of the magnetic element unit 65 has an orientation in the −Y direction or the Y direction.

In the example, the magnetic element unit 65 includes a first magnetic element 65*a* and a second magnetic element 65*b*. At least a portion of the first stacked unit SU1 is disposed between the first magnetic element 65*a* and the second magnetic element 65*b* in the third direction (the −Y direction or the Y direction).

In the case where the multiple stacked units SUx are provided, for example, the distance between the first magnetic element 65*a* and the first stacked unit SU1 is shorter than the distance between the multiple stacked units SUx. The distance between the second magnetic element 65*b* and the first stacked unit SU1 is shorter than the distance between the multiple stacked units SUx.

In the example, a current source 60 is connected to the first region 21*a* of the first conductive body 21 (each of the multiple conductive bodies 21*x*).

The calculating device 211 is, for example, an oscillator-array pattern matcher (a content addressable memory) that performs a content addressable memory operation. In the operation, for example, the input is performed by frequency shift keying; and the degree of the synchronous oscillation is output. The oscillator according to the embodiment can be used as such an oscillator-array pattern matcher.

Each of the multiple stacked units SUx receives a leakage magnetic field corresponding to the orientation of the magnetization M65 of the magnetic element unit 65. In each of the multiple stacked units SUx, the magnetizations of the first stacked body SB1 are modulated by the leakage magnetic field.

For example, in the example, information (two bits) are stored in the first magnetic element 65*a* and the second magnetic element 65*b*. Therefore, the stacked unit SUx that is disposed between the first magnetic element 65*a* and the second magnetic element 65*b* undergoes four types of frequency modulation. The information that is stored in the first magnetic element 65*a* and the second magnetic element 65*b* corresponds to the components of N-dimension vector data as template data. Each component of the N-dimension vector data is two bits.

The current source 60 is added for the first conductive body 21. In addition to the current due to the constant voltage source Vdd, a current flows in the first conductive body 21 due to the current source 60. The vibration frequencies of the magnetizations of the first stacked body SB1 are modulated by the current flowing in the first conductive body 21. Each of the multiple current sources 60 outputs a current corresponding to the component of the N-dimension vector data as the test data.

For example, the test data from the current source 60 is input as the frequency modulation of the magnetizations of the first stacked body SB1. Further, the template data from the magnetic element unit 65 is input as the frequency modulation of the magnetizations of the first stacked body SB1. In other words, frequency shift keying is performed.

The case where the component of the test data and the component of the template data are equal to each other is normalized so that, for example, the frequency shift is zero. For example, an output that reflects the degree of the synchronous oscillation of the magnetizations of the N first stacked bodies SB1 is extracted from the circuit unit 70. In the case where all of the components of the test data and all of the components of the template data are equal to each other, complete synchronization occurs; and the output is the largest. When there are many components having different values, the degree of the synchronization becomes small. For example, the pattern matching degree can be measured using the degree of the synchronous oscillation.

For example, it is also possible to utilize the calculating device 211 (e.g., the pattern matcher) of the example as a product-sum operator in a multilayer neural network. In such a case, the "learning weight" is stored in the magnetic element unit 65. For example, the output of the layer once previous is input to the current source 60.

Seventh Embodiment

The embodiment relates to an electronic device.

Figure 25:
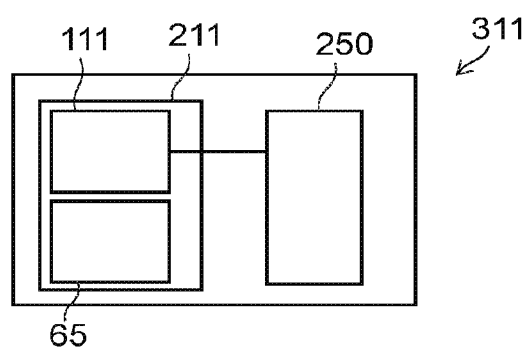
FIG. 25 is a schematic view illustrating the electronic device according to the seventh embodiment.

FIG. 25 is a schematic view illustrating the electronic device according to the seventh embodiment.

As shown in FIG. 26, the electronic device 311 according to the embodiment includes the oscillator according to the first to fifth embodiments (and modifications of the oscillators) and a functional unit 250. The oscillator 111 is illustrated in the example. The calculating device 211 may be provided as in the example.

For example, the functional unit 250 receives the output from the oscillator 111. The functional unit 250 performs operations based on the output. For example, the operations perform processing (including sending, receiving, modulation, amplification, etc.) of the signals. The electronic device 311 is, for example, a computer.

The embodiments include the following configurations.

(Configuration 1)

An oscillator, comprising:

a first conductive body including a first region, a second region, and a third region, the second region being arranged with the first region in a first direction, the third region being provided between the first region and the second region;

a second conductive body including a portion separated from the third region in a second direction crossing the first direction;

a first stacked unit provided between the third region and the portion, the first stacked unit including
   a first magnetic layer having a first magnetization,
   a second magnetic layer having a second magnetization and being provided between the first magnetic layer and the portion,
   a first intermediate layer provided between the first magnetic layer and the second magnetic layer, a third magnetic layer having a third magnetization and being provided between the second magnetic layer and the portion, a fourth magnetic layer having a fourth magnetization and being provided between the third magnetic layer and the portion, a second intermediate layer provided between the third magnetic layer and the fourth magnetic layer, and a third intermediate layer provided between the second magnetic layer and the third magnetic layer;

a third conductive body electrically connected to the second conductive body and the first region; and a magnetic unit, at least a portion of the magnetic unit and at least a portion of the first stacked unit overlapping each other in a direction crossing the first direction and the second direction, in a first state, the first to fourth magnetizations being aligned with a third direction perpendicular to the first direction and the second direction, the second magnetization having a component in a reverse orientation of the first magnetization, the fourth magnetization having a component in a reverse orientation of the third magnetization.

(Configuration 2)

The oscillator according to configuration 1, wherein a connection point connected to the second conductive body and the third conductive body oscillates in a second state, the second state including a first current flowing from the first region toward the second region, a second current flowing from the fourth magnetic layer toward the first magnetic layer, and a third current flowing through the third conductive body from the second conductive body toward the first region.

(Configuration 3)

The oscillator according to configuration 1 or 2, wherein a current magnetic field generated in a space between the third region and the portion has a first orientation along the third direction when a current is caused to flow in the first conductive body from the first region toward the second region, in the first state, a component in the first orientation of the first magnetization is larger than a component in the first direction of the first magnetization, and in the first state, a component in the first orientation of the fourth magnetization is larger than a component in the first direction of the fourth magnetization.

(Configuration 4)

The oscillator according to configuration 3, wherein the first conductive body includes at least one of Ta, W, or Re.

(Configuration 5)

The oscillator according to configuration 3 or 4, wherein a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

(Configuration 6)

The oscillator according to configuration 3 or 4, wherein a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

(Configuration 7)

The oscillator according to configuration 1 or 2, wherein a current magnetic field generated in a space between the third region and the portion has a first orientation along the third direction when a current is caused to flow in the first conductive body from the first region toward the second region, in the first state, a component in the first orientation of the second magnetization is larger than a component in the first direction of the second magnetization, and in the first state, a component in the first orientation of the third magnetization is larger than a component in the first direction of the third magnetization.

(Configuration 8)

The oscillator according to configuration 7, wherein the first conductive body includes at least one of Ru, Rh, Pd, Os, or Pt.

(Configuration 9)

The oscillator according to configuration 7 or 8, wherein a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

(Configuration 10)

The oscillator according to configuration 7 or 8, wherein a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

(Configuration 11)

The oscillator according to configuration 1, wherein a connection point connected to the second conductive body and the third conductive body oscillates in a second state, and the second state includes a first current flowing from the second region toward the first region, a second current flowing from the first magnetic layer toward the fourth magnetic layer, and a third current flowing through the third conductive body from the first region toward the second conductive body.

(Configuration 12)

The oscillator according to configuration 1 or 11, wherein a current magnetic field generated in a space between the third region and the portion has a first orientation along the third direction when a current is caused to flow in the first conductive body from the second region toward the first region, in the first state, a component in the first orientation of the second magnetization is larger than a component in the first direction of the second magnetization, in the first state, a component in the first orientation of the fourth magnetization is larger than a component in the first direction of the fourth magnetization, the first conductive body includes at least one of Ru, Rh, Pd, Os, or Pt, and in the first state, a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

(Configuration 13)

The oscillator according to configuration 1 or 11, wherein a current magnetic field generated in a space between the third region and the portion has a first orientation along the third direction when a current is caused to flow in the first conductive body from the second region toward the first region, in the first state, a component in the first orientation of the second magnetization is larger than a component in the first direction of the second magnetization, in the first state, a component in the first orientation of the fourth magnetization is larger than a component in the first direction of the fourth magnetization, the first conductive body includes at least one of Ru, Rh, Pd, Os, or Pt, and in the first state, a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

(Configuration 14)

The oscillator according to configuration 1 or 11, wherein a current magnetic field generated in a space between the third region and the portion has a first orientation along the third direction when a current is caused to flow in the first conductive body from the second region toward the first region, in the first state, a component in the first orientation of the first magnetization is larger than a component in the first direction of the first magnetization, in the first state, a component in the first orientation of the third magnetization is larger than a component in the first direction of the third magnetization, the first conductive body includes at least one of Ta, W, or Re, and in the first state, a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

(Configuration 15)

The oscillator according to configuration 1 or 11, wherein a current magnetic field generated in a space between the third region and the portion has a first orientation along the third direction when a current is caused to flow in the first conductive body from the second region toward the first region, in the first state, a component in the first orientation of the first magnetization is larger than a component in the first direction of the first magnetization, in the first state, a component in the first orientation of the third magnetization is larger than a component in the first direction of the third magnetization, the first conductive body includes at least one of Ta, W, or Re, and in the first state, a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

(Configuration 16)

An oscillator, comprising:

a first conductive body including a first region, a second region, and a third region, the second region being arranged with the first region in a first direction, the third region being provided between the first region and the second region;

a second conductive body including a portion separated from the third region in a second direction crossing the first direction;

a first stacked unit provided between the third region and the portion, the first stacked unit including a first magnetic layer having a first magnetization, a second magnetic layer having a second magnetization and being provided between the first magnetic layer and the portion, a first intermediate layer provided between the first magnetic layer and the second magnetic layer, a third magnetic layer having a third magnetization and being provided between the second magnetic layer and the portion, a fourth magnetic layer having a fourth magnetization and being provided between the third magnetic layer and the portion, a second intermediate layer provided between the third magnetic layer and the fourth magnetic layer, and a third intermediate layer provided between the second magnetic layer and the third magnetic layer; and a third conductive body electrically connected to the second conductive body and the first region, in a first state, the first to fourth magnetizations being aligned with a third direction perpendicular to the first direction and the second direction, the second magnetization having a component in a reverse orientation of the first magnetization, the fourth magnetization having a component in a reverse orientation of the third magnetization, a current magnetic field generated in a space between the third region and the portion, the current magnetic field having a first orientation along the third direction when a current is caused to flow in the first conductive body from the first region toward the second region, in the first state, a component in the first orientation of the first magnetization being larger than a component in the first direction of the first magnetization, in the first state, a component in the first orientation of the fourth magnetization being larger than a component in the first direction of the fourth magnetization, the first conductive body including at least one of Ta, W, or Re, the first stacked unit satisfying one of a first condition or a second condition in the first state, in the first condition, a first magnetic moment of the first magnetic layer being smaller than a second magnetic moment of the second magnetic layer, and a third magnetic moment of the third magnetic layer being smaller than a fourth magnetic moment of the fourth magnetic layer, in the second condition, the first magnetic moment of the first magnetic layer being larger than the second magnetic moment of the second magnetic layer, and the third magnetic moment of the third magnetic layer being larger than the fourth magnetic moment of the fourth magnetic layer.

(Configuration 17)

An oscillator, comprising:

a first conductive body including a first region, a second region, and a third region, the second region being arranged with the first region in a first direction, the third region being provided between the first region and the second region;

a second conductive body including a portion separated from the third region in a second direction crossing the first direction;

a first stacked unit provided between the third region and the portion, the first stacked unit including
  a first magnetic layer having a first magnetization,
  a second magnetic layer having a second magnetization and being provided between the first magnetic layer and the portion,
  a first intermediate layer provided between the first magnetic layer and the second magnetic layer,
  a third magnetic layer having a third magnetization and being provided between the second magnetic layer and the portion,
  a fourth magnetic layer having a fourth magnetization and being provided between the third magnetic layer and the portion,
  a second intermediate layer provided between the third magnetic layer and the fourth magnetic layer, and
  a third intermediate layer provided between the second magnetic layer and the third magnetic layer; and
a third conductive body electrically connected to the second conductive body and the first region,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion, the current magnetic field having a first orientation along the third direction when a current is caused to flow in a first conductive body from the first region toward the second region,
in the first state, a component in the first orientation of the second magnetization being larger than a component in the first direction of the second magnetization,
in the first state, a component in the first orientation of the third magnetization being larger than a component in the first direction of the third magnetization,
the first conductive body including at least one of Ru, Rh, Pd, Os, or Pt,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being smaller than a fourth magnetic moment of the fourth magnetic layer,
in the second condition, the first magnetic moment of the first magnetic layer being larger than the second magnetic moment of the second magnetic layer, and the third magnetic moment of the third magnetic layer being larger than the fourth magnetic moment of the fourth magnetic layer.
(Configuration 18)

An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
  a first magnetic layer having a first magnetization,
  a second magnetic layer having a second magnetization and being provided between the first magnetic layer and the portion,
  a first intermediate layer provided between the first magnetic layer and the second magnetic layer,
  a third magnetic layer having a third magnetization and being provided between the second magnetic layer and the portion,
  a fourth magnetic layer having a fourth magnetization and being provided between the third magnetic layer and the portion,
  a second intermediate layer provided between the third magnetic layer and the fourth magnetic layer, and
  a third intermediate layer provided between the second magnetic layer and the third magnetic layer; and
a third conductive body electrically connected to the second conductive body and the first region,
the first conductive body including at least one of Ru, Rh, Pd, Os, or Pt,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion having a first orientation along the third direction when a current is caused to flow in the first conductive body from the second region toward the first region,
in the first state, a component in the first orientation of the second magnetization being larger than a component in the first direction of the second magnetization, and a component in the first orientation of the fourth magnetization being larger than a component in the first direction of the fourth magnetization,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being larger than a fourth magnetic moment of the fourth magnetic layer,
in the second condition, the first magnetic moment of the first magnetic layer being larger than the second magnetic moment of the second magnetic layer, and the third magnetic moment of the third magnetic layer being smaller than the fourth magnetic moment of the fourth magnetic layer.
(Configuration 19)

An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
  a first magnetic layer having a first magnetization,
  a second magnetic layer having a second magnetization and being provided between the first magnetic layer and the portion,
  a first intermediate layer provided between the first magnetic layer and the second magnetic layer,
  a third magnetic layer having a third magnetization and being provided between the second magnetic layer and the portion, a fourth magnetic layer having a fourth magnetization and being provided between the third magnetic layer and the portion, a second intermediate layer provided between the third magnetic layer and the fourth magnetic layer, and a third intermediate layer provided between the second magnetic layer and the third magnetic layer; and a third conductive body electrically connected to the second conductive body and the first region, the first conductive body including at least one of Ta, W, or Re, in a first state, the first to fourth magnetizations being aligned with a third direction perpendicular to the first direction and the second direction, the second magnetization having a component in a reverse orientation of the first magnetization, the fourth magnetization having a component in a reverse orientation of the third magnetization, a current magnetic field generated in a space between the third region and the portion, the current magnetic field having a first orientation along the third direction when a current is caused to flow in the first conductive body from the second region toward the first region, a component in the first orientation of the first magnetization being larger than a component in the first direction of the first magnetization, and a component in the first orientation of the third magnetization being larger than a component in the first direction of the third magnetization, the first stacked unit satisfying one of a first condition or a second condition in the first state, in the first condition, a first magnetic moment of the first magnetic layer being smaller than a second magnetic moment of the second magnetic layer, and a third magnetic moment of the third magnetic layer being larger than a fourth magnetic moment of the fourth magnetic layer, in the second condition, the first magnetic moment of the first magnetic layer being larger than the second magnetic moment of the second magnetic layer, and the third magnetic moment of the third magnetic layer being smaller than the fourth magnetic moment of the fourth magnetic layer.

(Configuration 20)

The oscillator according to one of configurations 1 to 19, wherein an angle between the second magnetization and the third magnetization not less than minus 10 degrees and not more than plus 10 degrees, or not less than 170 degrees and not more than 190 degrees.

(Configuration 21)

The oscillator according to configurations 1 to 20, further comprising:

a fourth conductive body arranged with the first conductive body in the third direction, the fourth conductive body including a fourth region, a fifth region, and a sixth region, the fifth region being arranged with the fourth region in the first direction, the sixth region being provided between the fourth region and the fifth region;

a second stacked unit provided between the sixth region and another portion of the second conductive body, the second stacked unit including a fifth magnetic layer having a fifth magnetization, a sixth magnetic layer having a sixth magnetization and being provided between the fifth magnetic layer and the other portion, a fourth intermediate layer provided between the fifth magnetic layer and the sixth magnetic layer, a seventh magnetic layer having a seventh magnetization and being provided between the sixth magnetic layer and the other portion, an eighth magnetic layer having an eighth magnetization and being provided between the seventh magnetic layer and the other portion, a fifth intermediate layer provided between the seventh magnetic layer and the eighth magnetic layer, and a sixth intermediate layer provided between the sixth magnetic layer and the seventh magnetic layer; and a fifth conductive body electrically connected to the second conductive body and the fourth region, in the first state, the fifth to eighth magnetizations being aligned with the third direction, the sixth magnetization having a component in a reverse orientation of the fifth magnetization, the eighth magnetization having a component in a reverse orientation of the seventh magnetization.

(Configuration 22)

A calculating device, comprising:

the oscillator according to one of configurations 1 to 21; and a magnetic element unit, at least a portion of the magnetic element unit and at least a portion of the first stacked unit overlapping each other in the third direction.

(Configuration 23)

An electronic device, comprising:

the oscillator according to one of configurations 1 to 21; and a functional unit receiving an output from the oscillator.

According to the embodiments, an oscillator and a calculating device can be provided in which the oscillation can be stabilized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in oscillators such as conductive bodies, stacked bodies, stacked units, magnetic layers, magnetic units, circuit units, etc., and included in calculating devices such as magnetic elements from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all oscillators and calculating devices practicable by an appropriate design modification by one skilled in the art based on the oscillators and the calculating devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer;
a third conductive body electrically connected to the second conductive body and the first region; and
a magnetic unit, at least a portion of the magnetic unit and at least a portion of the first stacked unit overlapping each other in a direction crossing the first direction and the second direction,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization.

2. The oscillator according to claim 1, wherein a connection point connected to the second conductive body and the third conductive body oscillates in a second state, the second state including a first current flowing from the first region toward the second region, a second current flowing from the fourth magnetic layer toward the first magnetic layer, and a third current flowing through the third conductive body from the second conductive body toward the first region.

3. The oscillator according to claim 1, wherein
a current magnetic field generated in a space between the third region and the portion has a first orientation along the third direction when a current is caused to flow in the first conductive body from the first region toward the second region,
in the first state, a component in the first orientation of the first magnetization is larger than a component in the first direction of the first magnetization, and
in the first state, a component in the first orientation of the fourth magnetization is larger than a component in the first direction of the fourth magnetization.

4. The oscillator according to claim 3, wherein the first conductive body includes at least one of Ta, W, or Re.

5. The oscillator according to claim 3, wherein
a first magnetic moment of the first magnetic layer is smaller than a second magnetic moment of the second magnetic layer, and
a magnetic unit magnetic field has the orientation of the second magnetization, the magnetic unit magnetic field being in the space and being generated from the magnetic unit.

6. The oscillator according to claim 3, wherein
a first magnetic moment of the first magnetic layer is larger than a second magnetic moment of the second magnetic layer, and
a magnetic unit magnetic field has the orientation of the first magnetization, the magnetic unit magnetic field being in the space and being generated from the magnetic unit.

7. The oscillator according to claim 1, wherein
a current magnetic field generated in a space between the third region and the portion has a first orientation along the third direction when a current is caused to flow in the first conductive body from the first region toward the second region,
in the first state, a component in the first orientation of the second magnetization is larger than a component in the first direction of the second magnetization, and
in the first state, a component in the first orientation of the third magnetization is larger than a component in the first direction of the third magnetization.

8. The oscillator according to claim 7, wherein the first conductive body includes at least one of Ru, Rh, Pd, Os, or Pt.

9. The oscillator according to claim 7, wherein
a first magnetic moment of the first magnetic layer is smaller than a second magnetic moment of the second magnetic layer, and
a magnetic unit magnetic field has the orientation of the second magnetization, the magnetic unit magnetic field being in the space and being generated from the magnetic unit.

10. The oscillator according to claim 7, wherein
a first magnetic moment of the first magnetic layer is larger than a second magnetic moment of the second magnetic layer, and
a magnetic unit magnetic field has the orientation of the first magnetization, the magnetic unit magnetic field being in the space and being generated from the magnetic unit.

11. The oscillator according to claim 1, wherein
a connection point connected to the second conductive body and the third conductive body oscillates in a second state, and the second state includes a first current flowing from the second region toward the first region, a second current flowing from the first magnetic layer toward the fourth magnetic layer, and a third current flowing through the third conductive body from the first region toward the second conductive body.

12. The oscillator according to claim 1, wherein
a current magnetic field generated in a space between the third region and the portion has a first orientation along the third direction when a current is caused to flow in the first conductive body from the second region toward the first region, in the first state, a component in the first orientation of the second magnetization is larger than a component in the first direction of the second magnetization, in the first state, a component in the first orientation of the fourth magnetization is larger than a component in the first direction of the fourth magnetization, the first conductive body includes at least one of Ru, Rh, Pd, Os, or Pt, and in the first state, a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

13. The oscillator according to claim 1, wherein
a current magnetic field generated in a space between the third region and the portion has a first orientation along the third direction when a current is caused to flow in the first conductive body from the second region toward the first region, in the first state, a component in the first orientation of the second magnetization is larger than a component in the first direction of the second magnetization, in the first state, a component in the first orientation of the fourth magnetization is larger than a component in the first direction of the fourth magnetization, the first conductive body includes at least one of Ru, Rh, Pd, Os, or Pt, and in the first state, a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

14. The oscillator according to claim 1, wherein
a current magnetic field generated in a space between the third region and the portion has a first orientation along the third direction when a current is caused to flow in the first conductive body from the second region toward the first region, in the first state, a component in the first orientation of the first magnetization is larger than a component in the first direction of the first magnetization, in the first state, a component in the first orientation of the third magnetization is larger than a component in the first direction of the third magnetization, the first conductive body includes at least one of Ta, W, or Re, and in the first state, a first magnetic moment of the first magnetic layer is smaller than a second magnetic moment of the second magnetic layer, and a magnetic unit magnetic field has the orientation of the second magnetization, the magnetic unit magnetic field being in the space and being generated from the magnetic unit.

15. The oscillator according to claim 1, wherein
a current magnetic field generated in a space between the third region and the portion has a first orientation along the third direction when a current is caused to flow in the first conductive body from the second region toward the first region, in the first state, a component in the first orientation of the first magnetization is larger than a component in the first direction of the first magnetization, in the first state, a component in the first orientation of the third magnetization is larger than a component in the first direction of the third magnetization, the first conductive body includes at least one of Ta, W, or Re, and in the first state, a first magnetic moment of the first magnetic layer is larger than a second magnetic moment of the second magnetic layer, and a magnetic unit magnetic field has the orientation of the first magnetization, the magnetic unit magnetic field being in the space and being generated from the magnetic unit.

16. The oscillator according to claim 1, wherein an angle between the second magnetization and the third magnetization not less than minus 10 degrees and not more than plus 10 degrees, or not less than 170 degrees and not more than 190 degrees.

17. The oscillator according to claim 1, further comprising:
a fourth conductive body arranged with the first conductive body in the third direction, the fourth conductive body including a fourth region, a fifth region, and a sixth region, the fifth region being arranged with the fourth region in the first direction, the sixth region being provided between the fourth region and the fifth region;

a second stacked unit provided between the sixth region and another portion of the second conductive body, the second stacked unit including
a fifth magnetic layer having a fifth magnetization,
a sixth magnetic layer having a sixth magnetization and being provided between the fifth magnetic layer and the other portion,
a fourth intermediate layer provided between the fifth magnetic layer and the sixth magnetic layer,
a seventh magnetic layer having a seventh magnetization and being provided between the sixth magnetic layer and the other portion,
an eighth magnetic layer having an eighth magnetization and being provided between the seventh magnetic layer and the other portion,
a fifth intermediate layer provided between the seventh magnetic layer and the eighth magnetic layer, and
a sixth intermediate layer provided between the sixth magnetic layer and the seventh magnetic layer; and a fifth conductive body electrically connected to the second conductive body and the fourth region, in the first state, the fifth to eighth magnetizations being aligned with the third direction, the sixth magnetization having a component in a reverse orientation of the fifth magnetization, the eighth magnetization having a component in a reverse orientation of the seventh magnetization.

18. An oscillator, comprising:
a first conductive body including a first region, a second region, and a third region, the second region being arranged with the first region in a first direction, the third region being provided between the first region and the second region;

a second conductive body including a portion separated from the third region in a second direction crossing the first direction;

a first stacked unit provided between the third region and the portion, the first stacked unit including
a first magnetic layer having a first magnetization, a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer; and
a third conductive body electrically connected to the second conductive body and the first region,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion, the current magnetic field having a first orientation along the third direction when a current is caused to flow in the first conductive body from the first region toward the second region,
in the first state, a component in the first orientation of the first magnetization being larger than a component in the first direction of the first magnetization,
in the first state, a component in the first orientation of the fourth magnetization being larger than a component in the first direction of the fourth magnetization,
the first conductive body including at least one of Ta, W, or Re,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being smaller than a fourth magnetic moment of the fourth magnetic layer,
in the second condition, the first magnetic moment of the first magnetic layer being larger than the second magnetic moment of the second magnetic layer, and the third magnetic moment of the third magnetic layer being larger than the fourth magnetic moment of the fourth magnetic layer.

19. An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer; and
a third conductive body electrically connected to the second conductive body and the first region,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion, the current magnetic field having a first orientation along the third direction when a current is caused to flow in a first conductive body from the first region toward the second region,
in the first state, a component in the first orientation of the second magnetization being larger than a component in the first direction of the second magnetization,
in the first state, a component in the first orientation of the third magnetization being larger than a component in the first direction of the third magnetization,
the first conductive body including at least one of Ru, Rh, Pd, Os, or Pt,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being smaller than a fourth magnetic moment of the fourth magnetic layer,
in the second condition, the first magnetic moment of the first magnetic layer being larger than the second magnetic moment of the second magnetic layer, and the third magnetic moment of the third magnetic layer being larger than the fourth magnetic moment of the fourth magnetic layer.

20. An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer, a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer; and
a third conductive body electrically connected to the second conductive body and the first region,
the first conductive body including at least one of Ru, Rh, Pd, Os, or Pt,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion having a first orientation along the third direction when a current is caused to flow in the first conductive body from the second region toward the first region,
in the first state, a component in the first orientation of the second magnetization being larger than a component in the first direction of the second magnetization, and a component in the first orientation of the fourth magnetization being larger than a component in the first direction of the fourth magnetization,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being larger than a fourth magnetic moment of the fourth magnetic layer,
in the second condition, the first magnetic moment of the first magnetic layer being larger than the second magnetic moment of the second magnetic layer, and the third magnetic moment of the third magnetic layer being smaller than the fourth magnetic moment of the fourth magnetic layer.

21. An oscillator, comprising:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer; and
a third conductive body electrically connected to the second conductive body and the first region,
the first conductive body including at least one of Ta, W, or Re,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization,
a current magnetic field generated in a space between the third region and the portion, the current magnetic field having a first orientation along the third direction when a current is caused to flow in the first conductive body from the second region toward the first region,
a component in the first orientation of the first magnetization being larger than a component in the first direction of the first magnetization, and a component in the first orientation of the third magnetization being larger than a component in the first direction of the third magnetization,
the first stacked unit satisfying one of a first condition or a second condition in the first state,
in the first condition, a first magnetic moment of the first magnetic layer being smaller than a second magnetic moment of the second magnetic layer, and a third magnetic moment of the third magnetic layer being larger than a fourth magnetic moment of the fourth magnetic layer,
in the second condition, the first magnetic moment of the first magnetic layer being larger than the second magnetic moment of the second magnetic layer, and the third magnetic moment of the third magnetic layer being smaller than the fourth magnetic moment of the fourth magnetic layer.

22. A calculating device, comprising:
an oscillator; and
a magnetic element unit,
the oscillator including:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion, a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer;
a third conductive body electrically connected to the second conductive body and the first region; and
a magnetic unit, at least a portion of the magnetic unit and at least a portion of the first stacked unit overlapping each other in a direction crossing the first direction and the second direction,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization
at least a portion of the magnetic element unit and at least a portion of the first stacked unit overlapping each other in the third direction.

23. An electronic device, comprising:
an oscillator; and
a functional unit receiving an output from the oscillator
the oscillator including:
a first conductive body including a first region, a second region, and a third region, the second region being arranged with the first region in a first direction, the third region being provided between the first region and the second region;
a second conductive body including a portion separated from the third region in a second direction crossing the first direction;
a first stacked unit provided between the third region and the portion, the first stacked unit including
a first magnetic layer having a first magnetization,
a second magnetic layer having a second magnetization and being provided between the first magnetic layer and the portion,
a first intermediate layer provided between the first magnetic layer and the second magnetic layer,
a third magnetic layer having a third magnetization and being provided between the second magnetic layer and the portion,
a fourth magnetic layer having a fourth magnetization and being provided between the third magnetic layer and the portion,
a second intermediate layer provided between the third magnetic layer and the fourth magnetic layer, and
a third intermediate layer provided between the second magnetic layer and the third magnetic layer;
a third conductive body electrically connected to the second conductive body and the first region; and
a magnetic unit, at least a portion of the magnetic unit and at least a portion of the first stacked unit overlapping each other in a direction crossing the first direction and the second direction,
in a first state, the first to fourth magnetizations being aligned with a third direction perpendicular to the first direction and the second direction,
the second magnetization having a component in a reverse orientation of the first magnetization,
the fourth magnetization having a component in a reverse orientation of the third magnetization.

* * * * *